(12) United States Patent
Yun et al.

(10) Patent No.: US 11,282,827 B2
(45) Date of Patent: Mar. 22, 2022

(54) NONVOLATILE MEMORY DEVICE HAVING STACKED STRUCTURE WITH SPACED APART CONDUCTIVE LAYERS

(71) Applicant: SAMSUNG ELECTRONICS CO., LTD., Suwon-si (KR)

(72) Inventors: Kyunghwa Yun, Hwaseong-si (KR); Chanho Kim, Seoul (KR); Dongku Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/940,333

(22) Filed: Jul. 27, 2020

(65) Prior Publication Data

US 2021/0118861 A1 Apr. 22, 2021

Related U.S. Application Data

(63) Continuation-in-part of application No. 16/878,756, filed on May 20, 2020.

(30) Foreign Application Priority Data

Oct. 16, 2019 (KR) .................. 10-2019-0128221

(51) Int. Cl.
*H01L 25/18* (2006.01)
*H01L 23/00* (2006.01)
(Continued)

(52) U.S. Cl.
CPC .............. *H01L 25/18* (2013.01); *H01L 24/05* (2013.01); *H01L 24/08* (2013.01);
(Continued)

(58) Field of Classification Search
CPC .................. H01L 27/11526–11548; H01L 27/11551–11556; H01L 27/11556;
(Continued)

(56) References Cited

U.S. PATENT DOCUMENTS 7,679,133 B2  3/2010  Son et al.
8,044,448 B2  10/2011  Kamigaichi et al.
(Continued)

FOREIGN PATENT DOCUMENTS

KR     10-0582422 B1     5/2006

*Primary Examiner* — Sonya McCall-Shepard
(74) *Attorney, Agent, or Firm* — Sughrue Mion, PLLC

(57) ABSTRACT

A nonvolatile memory device includes a memory cell region including first metal pads, and a peripheral circuit region including second metal pads. The memory cell region includes a vertical structure including pairs of a first insulating layer and a first conductive layer, a second insulating layer on the vertical structure, a second conductive layer and a third conductive layer spaced apart from each other on the second insulating layer, first vertical channels and second vertical channels. The second conductive layer and the third conductive layer are connected with a first through via penetrating the vertical structure and a region of the second insulating layer that is exposed between the second conductive layer and the third conductive layer. The peripheral circuit region is vertically connected to the memory cell region by the first metal pads and the second metal pads directly.

20 Claims, 13 Drawing Sheets

(51) Int. Cl.
  *H01L 25/065* (2006.01)
  *H01L 27/11519* (2017.01)
  *H01L 27/11565* (2017.01)
  *H01L 27/11582* (2017.01)
  *H01L 25/00* (2006.01)
  *H01L 27/11548* (2017.01)
  *H01L 27/11575* (2017.01)
  *H01L 27/11556* (2017.01)

(52) U.S. Cl.
  CPC .... *H01L 25/0657* (2013.01); *H01L 27/11519* (2013.01); *H01L 27/11556* (2013.01); *H01L 27/11565* (2013.01); *H01L 27/11582* (2013.01); *H01L 2224/05147* (2013.01); *H01L 2224/08145* (2013.01); *H01L 2924/1431* (2013.01); *H01L 2924/14511* (2013.01)

(58) Field of Classification Search
  CPC ......... H01L 27/11582; H01L 27/11548; H01L 27/11575; H01L 25/18; H01L 25/0657; H01L 2224/08145; H01L 24/05; H01L 24/08; H01L 2224/08147; H01L 27/11519; H01L 27/11565; H01L 27/1157; H01L 2924/14511; H01L 2924/1431; H01L 23/528; H01L 27/11573; H01L 27/0688; H01L 23/5226

See application file for complete search history.

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,822,285 B2 | 9/2014 | Hwang et al. |
| 9,099,347 B2 | 8/2015 | Yun et al. |
| 10,134,747 B2 | 11/2018 | Lee |
| 10,177,224 B1 | 1/2019 | Park et al. |
| 10,249,640 B2 | 4/2019 | Yu et al. |
| 10,290,581 B2 | 5/2019 | Tessariol et al. |
| 2005/0254303 A1 | 11/2005 | Park |
| 2011/0233648 A1 | 9/2011 | Seol et al. |
| 2014/0027838 A1 | 1/2014 | Kido et al. |
| 2020/0312830 A1* | 10/2020 | Oh .......................... H01L 24/08 |

* cited by examiner

NONVOLATILE MEMORY DEVICE HAVING STACKED STRUCTURE WITH SPACED APART CONDUCTIVE LAYERS

CROSS-REFERENCE TO RELATED APPLICATIONS

This application is a Continuation-In-Part of U.S. application Ser. No. 16/878,756 filed on May 20, 2020, which claims priority under 35 U.S.C. § 119 to Korean Patent Application No. 10-2019-0128221 filed on Oct. 16, 2019, in the Korean Intellectual Property Office, the disclosures of each of which are incorporated by reference herein in their entireties.

BACKGROUND

1. Field

The present disclosure relates to a semiconductor memory, and more particularly, relates to a nonvolatile memory device.

2. Description of Related Art

A nonvolatile memory device may have a three-dimensional structure. The nonvolatile memory device of the three-dimensional structure has a structure in which pairs of an insulating layer and a conductive layer are stacked. A conductive layer may include cell transistors and a wire connected to the cell transistors. In general, as the conductivity of conductive layers increases, the performance of the nonvolatile memory device may be improved.

Due to various process issues, some of the conductive layers of the nonvolatile memory device may include a material having lower conductivity than the remaining conductive layers. However, such lower conductivity materials tend to degrade performance. Therefore, it is advantageous to provide a new device or method that prevents a reduction of performance while adopting some conductive layers including a material having lower conductivity than the remaining conductive layers.

SUMMARY

It is an aspect to provide a nonvolatile memory device that prevents a reduction of performance while adopting some conductive layers that include a material having a lower conductivity than remaining conductive layers.

According to an aspect of an exemplary embodiment, there is provided a nonvolatile memory device comprising a memory cell region including first metal pads; and a peripheral circuit region that includes a plurality of elements and second metal pads; wherein the memory cell region further comprises a vertical structure including a plurality of layer pairs, each layer pair including a first insulating layer and a first conductive layer that extend along a first direction and that are stacked in a second direction perpendicular to the first direction; a second insulating layer on the vertical structure; a second conductive layer and a third conductive layer on the second insulating layer, the second conductive layer and the third conductive layer being spaced apart from each other along the first direction to expose a first region of the second insulating layer between the second conductive layer and the third conductive layer; a plurality of first vertical channels that penetrate the second conductive layer, the second insulating layer, and the vertical structure in the second direction; and a plurality of second vertical channels that penetrate the third conductive layer, the second insulating layer, and the vertical structure in the second direction, wherein the second conductive layer and the third conductive layer are connected with a first part of the first metal pads, and the peripheral circuit region is vertically connected to the memory cell region by the first metal pads and the second metal pads directly.

According to another aspect of an exemplary embodiment, there is provided a nonvolatile memory device comprising a peripheral circuit region that includes a first metal pads and at least three pass transistors; and a memory cell region comprising a second metal pads; a vertical structure including a plurality of layer pairs, each layer pair including a first insulating layer and a first conductive layer that extend along a first direction and are stacked on the second active region in a second direction perpendicular to the first direction; a second insulating layer on the vertical structure; a second conductive layer and a third conductive layer on the second insulating layer, the second conductive layer and the third conductive layer being spaced apart from each other in the first direction to expose a region of the second insulating area between the second conductive layer and the third conductive layer; a plurality of first vertical channels that penetrate the second conductive layer, the second insulating layer, and the vertical structure in the second direction; and a plurality of second vertical channels that penetrate the third conductive layer, the second insulating layer, and the vertical structure in the second direction, wherein the at least three pass transistors supply a common voltage to the second conductive layer and the third conductive layer through at least three of the first metal pads and at least three of the second metal pads, and the peripheral circuit region is vertically connected to the memory cell region by the first metal pads and the second metal pads directly.

According to yet another aspect of an exemplary embodiment, there is provided a nonvolatile memory device comprising a peripheral circuit region that includes a first metal pads and a plurality of elements; and a memory cell region comprising a second metal pads; a vertical structure including a plurality of layer pairs, each layer pair including a first insulating layer and a first conductive layer that extend along a first direction and are stacked on the second active region in a second direction perpendicular to the first direction; a second insulating layer on the vertical structure; a second conductive layer and a third conductive layer on the second insulating layer, the second conductive layer and the third conducive layer being spaced apart from each other in the first direction to expose a first region of the second insulating layer between the second conductive layer and the third conductive layer; a fourth conductive layer and a fifth conductive layer on the second insulating layer, the fourth conductive layer and the fifth conductive layer being spaced apart from each other in the first direction to expose a second region of the second insulating layer between the fourth conductive layer and the fifth conductive layer, and being parallel to the second conductive layer and the third conductive layer in a third direction perpendicular to the first direction and the second direction; a sixth conductive layer and a seventh conductive layer on the second insulating layer, the sixth conductive layer and the seventh conductive layer being spaced apart from each other in the first direction to expose a third region of the second insulating layer between the sixth conductive layer and the seventh conductive layer, and being parallel to the fourth conductive layer and the fifth conductive layer in the third direction; and a plurality of vertical channels that penetrate the vertical structure in the second direction, wherein the second conductive layer and the third conductive layer are connected with a first part of the second metal pads; wherein the fourth conductive layer and the fifth conductive layer are connected with a second part of the second metal pads; and wherein the sixth conductive layer and the seventh conductive layer are connected with a third part of the second metal pads, and the peripheral circuit region is vertically connected to the memory cell region by the first metal pads and the second metal pads directly.

According to yet another aspect of an exemplary embodiment, there is provided a nonvolatile memory device comprising a peripheral circuit that includes a first active region and a pass transistor formed on the first active region; and a memory block comprising a second active region on the peripheral circuit; a vertical structure including a plurality of first insulating layers and a plurality of first conductive layers that are alternatively stacked on the second active region, the plurality of first conductive layer comprising tungsten; a second insulating layer on the vertical structure; a second conductive layer comprising polysilicon and being separated into a first partial conductive layer and a second partial conductive layer that spaced apart from each other to expose a region of the second insulating layer between the first partial conductive layer and the second partial conductive layer; a plurality of vertical channels that penetrate the second conductive layer, the second insulating layer, and the vertical structure; and wherein the pass transistor is connected to the first partial conductive layer and the second partial conductive layer through a through via that penetrates the second active region, the vertical structure and the region that is exposed between the first partial conductive layer and the second partial conductive layer, and is configured to supply a common voltage to the first partial conductive layer and the second partial conductive layer.

According to yet another aspect of an exemplary embodiment, there is provided a nonvolatile memory device comprising a peripheral circuit that includes a pass transistor formed thereon; and a memory block comprising a vertical structure including a plurality of first insulating layers and a plurality of first conductive layers that are alternatively stacked on peripheral circuit, the plurality of first conductive layer comprising tungsten, wherein the memory block is defined by a plurality of word line cuts, an uppermost conductive layer of the plurality of first conductive layers is separated into a first partial conductive layer and a second partial conductive layer that are spaced apart from each other to expose a region of a first insulating layer of the plurality of first insulating layers, the uppermost conductive layer comprises polysilicon, and each of the first partial conductive layer and the second partial conductive layer comprises a plurality of portions divided by string selection line cuts.

BRIEF DESCRIPTION OF THE FIGURES

The above and other aspects will become apparent by describing in detail exemplary embodiments thereof with reference to the accompanying drawings, in which.

DETAILED DESCRIPTION

Below, various exemplary embodiments will be described in detail and clearly to such an extent that an ordinary one in the art may easily implements the inventive concepts of the present disclosure.

Figure 1:
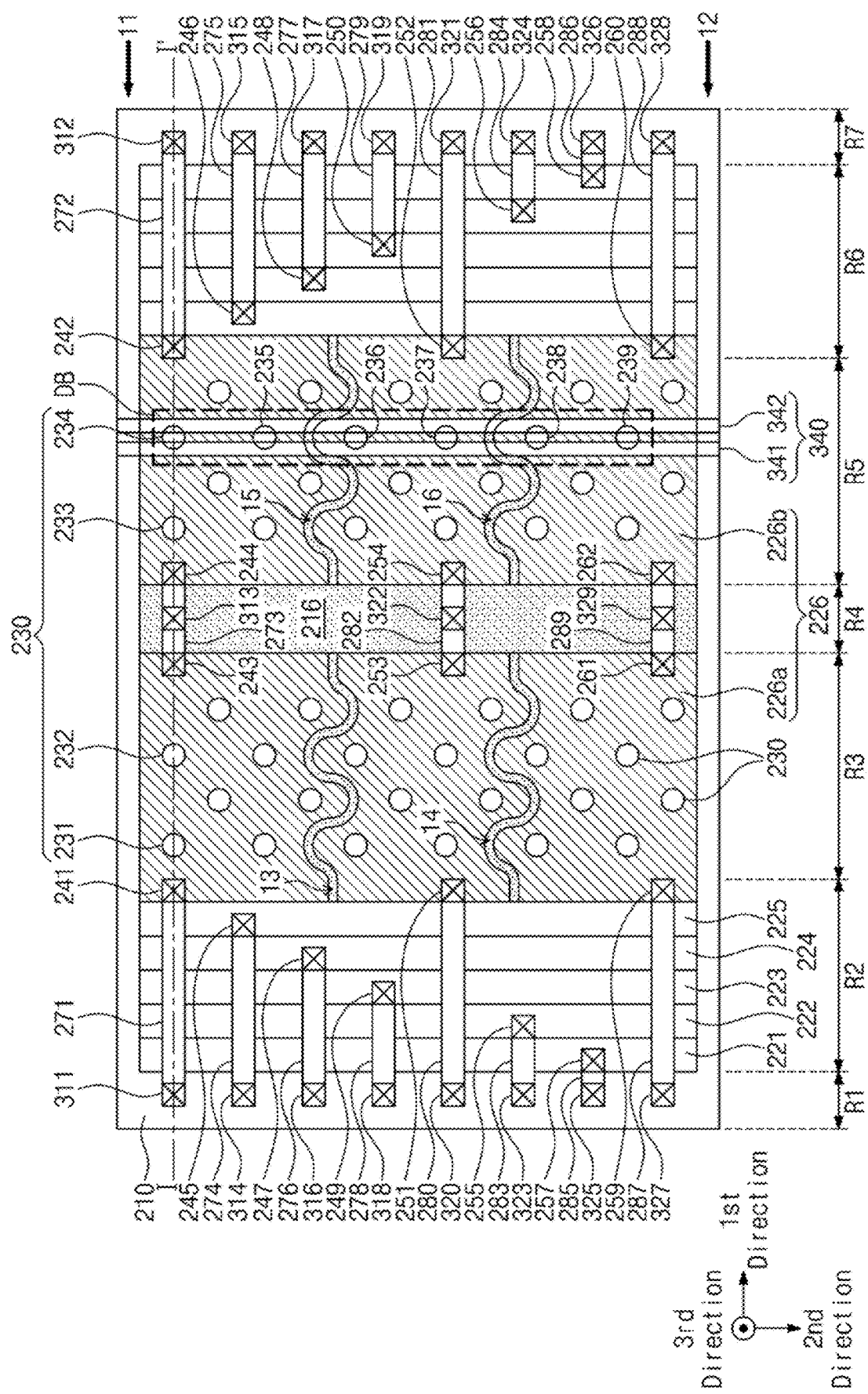
FIG. 1 is a plan view illustrating a nonvolatile memory device according to an exemplary embodiment.
Figure 2:
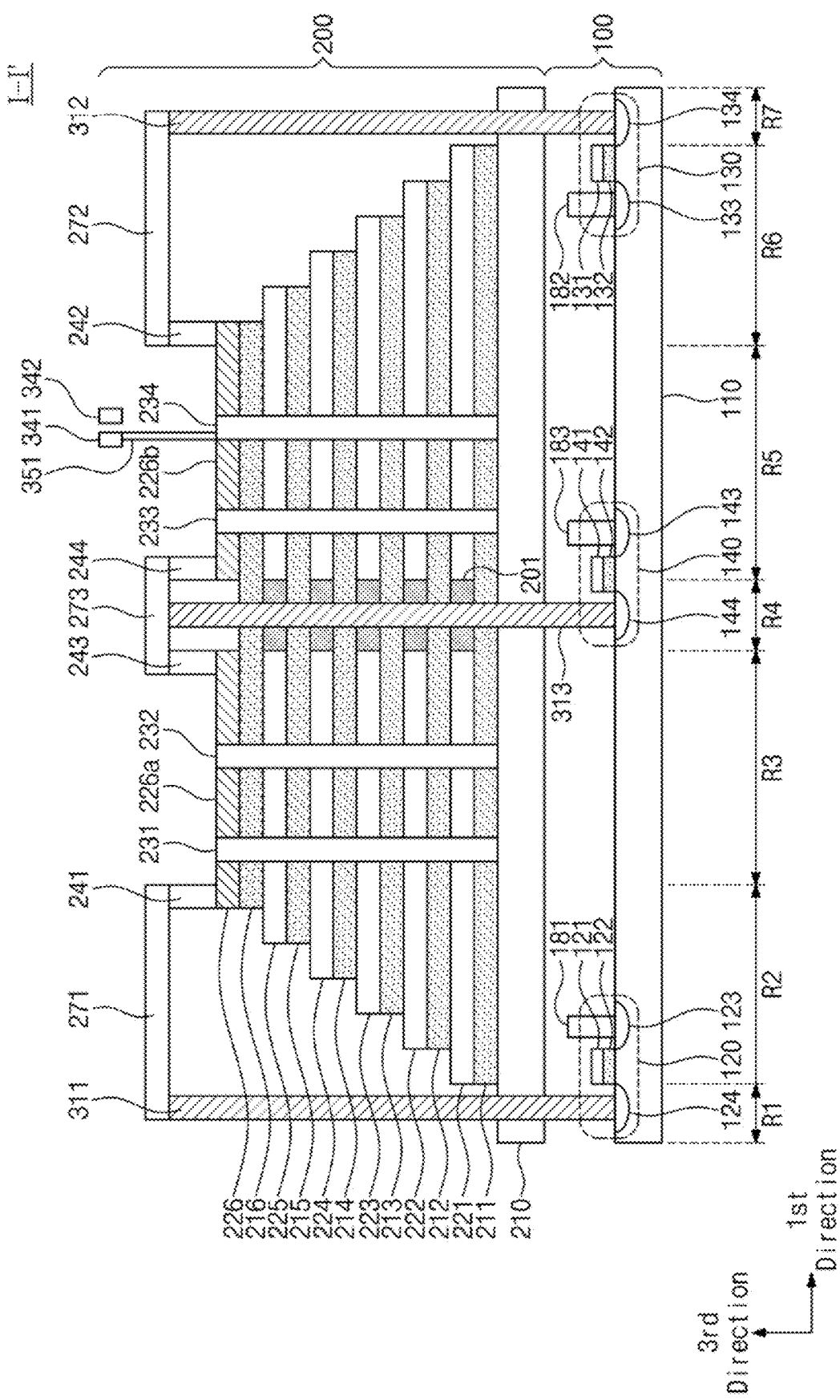
FIG. 2 is a cross-sectional view of the nonvolatile memory device of FIG. 1, taken along a line I-I' of FIG. 1.

FIG. 1 is a plan view illustrating a nonvolatile memory device according to an exemplary embodiment. FIG. 2 is a cross-sectional view of the nonvolatile memory device taken along a line I-I' of FIG. 1.

Referring to FIGS. 1 and 2, a nonvolatile memory device may include a peripheral circuit 100 and a memory block 200 on the peripheral circuit 100. For example, the nonvolatile memory device may include a cell over peri (COP) structure.

The peripheral circuit 100 may include a first active region 110, and a plurality of elements 120, 130, and 140 on the first active region 110. The first active region 110 may be formed on a semiconductor substrate. The elements 120, 130, and 140 may include a first pass transistor 120, a second pass transistor 130, and a third pass transistor 140.

The first pass transistor 120 may include a gate 121, an insulating layer 122, a first junction 123, and a second junction 124. The second pass transistor 130 may include a gate 131, an insulating layer 132, a first junction 133, and a second junction 134. The third pass transistor 140 may include a gate 141, an insulating layer 142, a first junction 143, and a second junction 144.

The first junction 123 of the first pass transistor 120 may be connected to a first peripheral circuit via 181. The first peripheral circuit via 181 may be connected to a wire not illustrated. The second junction 124 of the first pass transistor 120 may be connected to a first through via 311. For example, the first through via 311 may be a through hole via (THV).

The first junction 133 of the second pass transistor 130 may be connected to a second peripheral circuit via 182. The second peripheral circuit via 182 may be connected to a wire not illustrated. The second junction 134 of the second pass transistor 130 may be connected to a second through via 312. For example, the second through via 312 may be a through hole via (THV).

The first junction 143 of the third pass transistor 140 may be connected to a third peripheral circuit via 183. The third peripheral circuit via 183 may be connected to a wire not illustrated. The second junction 144 of the third pass transistor 140 may be connected to a third through via 313. For example, the third through via 313 may be a through hole via (THV).

The gate 121 of the first pass transistor 120, the gate 131 of the second pass transistor 130, and the gate 141 of the third pass transistor 140 may be connected to a common wire. The first peripheral circuit via 181, the second peripheral circuit via 182, and the third peripheral circuit via 183 may be connected to a common wire.

That is, the first pass transistor 120, the second pass transistor 130, and the third pass transistor 140 may respectively transfer a common voltage of a common wire to the first through via 311, the second through via 312, and the third through via 313 in response to a common control signal.

In the exemplary embodiment illustrated in FIGS. 1 and 2, only elements connected with the first through via 311, the second through via 312, and the third through via 313 from among elements of the peripheral circuit 100 are illustrated in FIG. 2. However, this is only an example and, in some exemplary embodiments, elements not illustrated in FIG. 2 may be added to the peripheral circuit 100.

A first region R1, a second region R2, a third region R3, a fourth region R4, a fifth region R5, a sixth region R6 and a seventh region R7 may be divided in a first direction according to distinct characteristics of elements of the memory block 200. For convenience of description, the memory block 200 illustrated in FIGS. 1 and 2 is divided into the first to seventh regions R1 to R7. However, this is only an example and, in other exemplary embodiments, a different number and placement of regions may be provided. Thus, the first to seventh regions R1 to R7 illustrated in FIGS. 1-2 do not limit the technical idea and distinct characteristics of the inventive concept.

The memory block 200 may include a second active region 210 and a vertical structure on the second active region 210. The vertical structure may include a plurality of layer pairs, including a layer pair of a first insulating layer 211 and a first conductive layer 221, a layer pair of a second insulating layer 212 and a second conductive layer 222, a layer pair of a third insulating layer 213 and a third conductive layer 223, a layer pair of a fourth insulating layer 214 and a fourth conductive layer 224, and a layer pair of a fifth insulating layer 215 and a fifth conductive layer 225, which are sequentially stacked on the second active region 210 as illustrated in FIG. 2.

The vertical structure may be extended along the first direction. In an exemplary embodiment, the vertical structure may also extend along a second direction. A first word line cut 11 that separates the vertical structure from another vertical structure or another element may be placed on one side of the vertical structure in the second direction, as illustrated in FIG. 1. A second word line cut 12 that separates the vertical structure from another vertical structure or another element may be placed on another side of the vertical structure in the second direction, as illustrated in FIG. 1.

A layer pair of a sixth insulating layer 216 and a sixth conductive layer 226 may be provided on the vertical structure. The sixth conductive layer 226 may include a first partial conductive layer 226a and a second partial conductive layer 226b, which are spaced apart from each other in the first direction so as to face each other along the first direction. In other words, the first partial conductive layer 226a and the second partial conductive layer 226b may be adjacent to but separated from each other in the first direction. The first partial conductive layer 226a and the second partial conductive layer 226b may be spaced apart from each other along the first direction such a portion of the sixth insulating layer 216, which belongs to the fourth region R4, is exposed. In other words, the portion of the sixth insulating layer 216 that is exposed is not covered by the sixth conductive layer 226, as best seen in FIG. 2. The fourth region R4 may be, for example, a string selection line stair.

The first partial conductive layer 226a may be divided into three (or three or more) conductive layers by a first string selection line cut 13 and a second string selection line cut 14, which progresses along the first direction in the shape of a wave, as illustrated in FIG. 1. The second partial conductive layer 226b may be divided into three (or three or more) conductive layers by a third string selection line cut 15 and a fourth string selection line cut 16, which progresses along the first direction in the shape of a wave. That is, boundaries between each two of the three conductive layers of the sixth conductive layer 226 in the second direction may have the shape of a wave progressing along the first direction.

That is, depending on a point of view, the sixth conductive layer 226 may include six portions, the six portions corresponding to six conductive layers separated by the first to fourth string selection line cuts 13 to 16 and the string selection line stair. Alternatively, in some exemplary embodiments, the sixth conductive layer 226 may include the first partial conductive layer 226a and the second partial conductive layer 226b separated only by the string selection line stair. Alternatively, in some exemplary embodiments, the sixth conductive layer 226 may include only the three conductive layers (or conductive lines) that are separated by the first to fourth string selection line cuts 13 to 16, where the three conductive layers (or conductive lines) are electrically connected in the first direction, and are extended in the first direction (in other words, the string selection line stair may be omitted in such exemplary embodiments).

In the third region R3 and the fifth region R5, a plurality of vertical channels 230 may penetrate the sixth conductive layer 226, the sixth insulating layer 216, and the vertical structure in the third direction. The vertical channels 230 may include a first vertical channel 231, a second vertical channel 232, a third vertical channel 233, a fourth vertical channel 234, a fifth vertical channel 235, a sixth vertical channel 236, a seventh vertical channel 237, an eight vertical channel 238, and a ninth vertical channel 239. The vertical channels may form cell transistors (refer to FIG. 11) stacked in the third direction together with the first to sixth conductive layers 221 to 226.

In an exemplary embodiment, an information storage layer including a silicon oxide layer, a silicon nitride layer, and a silicon oxide layer may be formed between the first to sixth conductive layers 221 to 226 and the vertical channels 230. The first to sixth conductive layers 221 to 226 may each be a wire (refer to FIG. 11) that is extended along the first direction and that connects the cell transistors.

In an exemplary embodiment, the string selection line cut 13, 14, 15, or 16 may have a wave shape such that a distance (i.e., a distance on a plane defined by the first direction and the second direction) from a vertical channel 230 that is the closest thereto is maintained at a threshold distance or greater. In other words, the vertical channels 230 that are respectively adjacent to the string selection line cuts 13, 14, 15 or 16 are a threshold distance or more from the respective string selection line cuts 13, 14, 15, or 16. In the case where the distance of the threshold distance or great is maintained, a defect (e.g., a short circuit of the string selection line cut 13, 14, 15, or 16 with a vertical channel 230) may be prevented in manufacturing the nonvolatile memory device.

In the second region R2 and the sixth region R6, lengths (i.e., lengths in the first direction) of each of the plurality of layer pairs may decrease in the third direction to form the shape of a stair along the third direction, as illustrated in FIG. 2. For example, lengths of the layer pair of the first insulating layer 211 and the first conductive layer 221 to the layer pair of the sixth insulating layer 216 and the sixth conductive layer 226 may decrease in the shape of a stair along the third direction. The second region R2 and the sixth region R6 may be a word line stair.

The first through via 311 may penetrate the second active region 210 in the first region R1 and may extend in the third direction. The first through via 311 may be connected with a first memory cell via 241 through a first upper conductive layer 271. For example, the first through via 311 may be connected with the first memory cell via 241 that is on a conductive layer among the conductive layers included in the first partial conductive layer 226a that comes first in the second direction, as best seen in FIG. 2. The second through via 312 may penetrate the second active region 210 in the seventh region R7 and may extend in the third direction. The second through via 312 may be connected with a second memory cell via 242 through a second upper conductive layer 272. For example, the second through via 312 may be connected with the second memory cell via 242 that is on a conductive layer among the conductive layers included in the second partial conductive layer 226b that comes first in the second direction, as best seen in FIG. 2.

The third through via 313 may penetrate the sixth insulating layer 216, the vertical structure, and the second active region 210 in the fourth region R4 and may extend in the third direction. The third through via 313 may be connected with a third memory cell via 243 and a fourth memory cell via 244 through a third upper conductive layer 273. For example, the third through via 313 may be connected with the third memory cell via 243 that is on a conductive layer from among the conductive layers included in the first partial conductive layer 226a that comes first in the second direction, and the third through via 313 may be connected with the fourth memory cell via 244 that is on a conductive layer from among the conductive layers included in the second partial conductive layer 226b that is comes first in the second direction, as best seen in FIG. 1.

A fourth through via 314 may penetrate the second active region 210 in the first region R1 and may be extended in the third direction. The fourth through via 314 may be connected with a fifth memory cell via 245 on the fifth conductive layer 225 through a fourth upper conductive layer 274. A fifth through via 315 may penetrate the second active region 210 in the seventh region R7 and may be extended in the third direction. The fifth through via 315 may be connected with a sixth memory cell via 246 on the fifth conductive layer 225 through a fifth upper conductive layer 275.

A sixth through via 316 may penetrate the second active region 210 in the first region R1 and may be connected with a seventh memory cell via 247 on the fourth conductive layer 224 through a sixth upper conductive layer 276. A seventh through via 317 may penetrate the second active region 210 in the seventh region R7 and may be connected with an eighth memory cell via 248 on the fourth conductive layer 224 through a seventh upper conductive layer 277.

An eighth through via 318 may penetrate the second active region 210 in the first region R1 and may be connected with a ninth memory cell via 249 on the third conductive layer 223 through an eighth upper conductive layer 278. A ninth through via 319 may penetrate the second active region 210 in the seventh region R7 and may be connected with a tenth memory cell via 250 on the third conductive layer 223 through a ninth upper conductive layer 279.

A tenth through via 320 may penetrate the second active region 210 in the first region R1 and may be extended in the third direction. The tenth through via 320 may be connected with an eleventh memory cell via 251 through a tenth upper conductive layer 280. For example, the tenth through via 320 may be connected with the eleventh memory cell via 251 that is on a conductive layer from among the conductive layers included in the first partial conductive layer 226a that comes second in the second direction. An eleventh through via 321 may penetrate the second active region 210 in the seventh region R7 and may extend in the third direction. The eleventh through via 321 may be connected with a twelfth memory cell via 252 through an eleventh upper conductive layer 281. For example, the eleventh through via 321 may be connected with a twelfth memory cell via 252 that is on a conductive layer from among the conductive layers included in the second partial conductive layer 226b that comes second in the second direction.

A twelfth through via 322 may penetrate the sixth insulating layer 216, the vertical structure, and the second active region 210 in the fourth region R4 and may be extended in the third direction. The twelfth through via 322 may be connected with a thirteenth memory cell via 253 and a fourteenth memory cell via 254 through a twelfth upper conductive layer 282. For example, the twelfth through via 322 may be connected with the thirteenth memory cell via 253 on a conductive layer from among the conductive layers included in the first partial conductive layer 226a that is second in the second direction, and the twelfth through via 322 may be connected with the fourteenth memory cell via 254 on a conductive layer from among the conductive layers included in the second partial conductive layer 226b that is second in the second direction, as best seen in FIG. 1.

A thirteenth through via 323 may penetrate the second active region 210 in the first region R1 and may be connected with a fifteenth memory cell via 255 on the second conductive layer 222 through a thirteenth upper conductive layer 283. A fourteenth through via 324 may penetrate the second active region 210 in the seventh region R7 and may be connected with a sixteenth memory cell via 256 on the second conductive layer 222 through a fourteenth upper conductive layer 284.

A fifteenth through via 325 may penetrate the second active region 210 in the first region R1 and may be connected with a seventeenth memory cell via 257 on the first conductive layer 221 through a fifteenth upper conductive layer 285. A sixteenth through via 326 may penetrate the second active region 210 in the seventh region R7 and may be connected with an eighteenth memory cell via 258 on the first conductive layer 221 through a sixteenth upper conductive layer 286.

A seventeenth through via 327 may penetrate the second active region 210 in the first region R1 and may be extended in the third direction. The seventeenth through via 327 may be connected with a nineteenth memory cell via 259 through a seventeenth upper conductive layer 287. For example, the seventeenth through via 327 may be connected with the nineteenth memory cell via 259 on a conductive layer from among the conductive layers included in the first partial conductive layer 226a that comes third in the second direction. An eighteenth through via 328 may penetrate the second active region 210 in the seventh region R7 and may be extended in the third direction. The eighteenth through via 328 may be connected with a twentieth memory cell via 260 through an eighteenth upper conductive layer 288. For example, the eighteenth through via 328 may be connected with the twentieth memory cell via 260 on a conductive layer from among the conductive layers included in the second partial conductive layer 226b that comes third in the second direction, as best seen in FIG. 1.

A nineteenth through via 329 may penetrate the sixth insulating layer 216, the vertical structure, and the second active region 210 in the fourth region R4 and may be extended in the third direction. The nineteenth through via 329 may be connected with a twenty-first memory cell via 261 and a twenty-second memory cell via 262 through a the nineteenth upper conductive layer 289. For example, the nineteenth through via 329 may be connected with the twenty-first memory cell via 261 on a conductive layer from among the conductive layers included in the first partial conductive layer 226a that is third in the second direction, and the nineteenth through via 329 may be connected with the twenty-second memory cell via 262 on a conductive layer from among the conductive layers included in the second partial conductive layer 226b that is third in the second direction, as best seen in FIG. 1.

A plurality of first insulating materials 201 may be provided between the first to fifth conductive layers 221 to 225, such that the third through via 313, the twelfth through via 322, and the nineteenth through via 329 penetrate through the plurality of first insulating materials 201 in the fourth region R4, as best seen in FIG. 2. The first insulating materials 201 may be identical to or different from insulating materials of the first to sixth insulating layers 211 to 216.

In the third region R3 and the fifth region R5, a plurality of conductive lines 340 may be provided above the sixth conductive layer 226. To prevent FIGS. 1-2 from being unnecessarily complicated, only two conductive lines, that is, a first conductive line 341 and a second conductive line 342 are illustrated by way of example in FIGS. 1 and 2. For example, the first and second conductive lines 341 and 342 may correspond to one column of the vertical channels 230 in the second direction. It will be understood that other ones of the conductive lines 340 (not illustrated) would correspond to other columns of the vertical channels 230 in the second direction.

In the one column of the vertical channels 230 in the second direction, one conductive line (e.g., the first conductive line 341) may be connected to odd-numbered vertical channels through a conductive line via 351. In the one column of the vertical channels 230 in the second direction, the other conductive line (e.g., the second conductive line 342) may be connected to even-numbered vertical channels through a conductive line via (not illustrated).

Two columns of vertical channels that extend along the second direction may be classified as one vertical channel group. Vertical channels may be alternately disposed along the second direction with respective two columns belonging to one vertical channel group. As illustrated in FIG. 1, 12 (or more) vertical channels may be included in one vertical channel group.

Due to processing issues, the first to fifth conductive layers 221 to 225 may be manufactured by injecting a metal material, such as tungsten, through the first word line cut 11 and the second word line cut 12. However, in the case of manufacturing the sixth conductive layer 226 by injecting a metal material, a conductive layer between the first string selection line cut 13 and the second string selection line cut 14 may be manufactured by injecting a metal material through the first string selection line cut 13 and the second string selection line cut 14.

Likewise, a conductive layer between the third string selection line cut 15 and the fourth string selection line cut 16 may be manufactured by injecting a metal material through the third string selection line cut 15 and the fourth string selection line cut 16.

In other words, since the sixth conductive layer 226 is separated into different portions by the first to fourth string selection line cuts 13-16 as described above, the metal material for the sixth conductive layer 226 may be injected through the first to fourth string selection line cuts 13-16.

The first to fourth string selection line cuts 13 to 16 may have a width (i.e., a width in the first direction) smaller than the first and second word line cuts 11 and 12. In other words, the first and second word line cuts 11 and 12 have a width from the first region R1 to the seventh region R7 inclusive, whereas the first and second string selection line cuts 13-14 have a width corresponding to the third region R3 and the third and fourth string selection line cuts 15-16 have a width corresponding to the fifth region R5. Accordingly, the metal material may fail to be normally injected through the first to fourth string selection line cuts 13 to 16. Conductive layers between the first to fourth string selection line cuts 13 to 16 thus may not be normally formed.

To solve this problem, the sixth conductive layer 226 may be manufactured by using a stack-possible or growth-possible material such as polysilicon. However, the polysilicon may have conductivity considerably lower than a metal material such as tungsten. Accordingly, the performance of the memory block 200 may decrease.

To prevent the performance of the sixth conductive layer 226 from being reduced, the nonvolatile memory device according to various exemplary embodiments may divide the sixth conductive layer 226 into the first partial conductive layer 226a and the second partial conductive layer 226b through the string selection line stair of the fourth region R4. Because the length of the sixth conductive layer 226 decreases due to being divided into the first and second partial conductive layers 226a and 226b, the resistance thereof decreases.

Also, in some exemplary embodiments, in addition a voltage may be applied to the sixth conductive layer 226 through the through vias 313, 322, and 329 that penetrate the string selection line stair of the vertical structure of the fourth region R4, the string selection line stair being perpendicular to the first to fourth string selection line cuts 13 to 16. In other words, the first to fourth string selection line cutes 13 to 16 are in the plane of the first and second directions, whereas the string selection line stair extends in the third direction. Due to this configuration, a voltage may be applied to the sixth conductive layer 226 (i.e., to the portions of the first and second partial conductive layers 226a and 226b) that is stronger than a voltage applied to the other conductive layers 211-215, thus compensating for the reduction of performance due to an increase in the resistance of the sixth conductive layer 226 by the use of polysilicon for the sixth conductive layer 226.

In FIG. 1, detailed positions of the first to nineteenth through vias 311 to 329 are illustrated as an example. However, exemplary embodiments are not limited to the positions illustrated in FIG. 1. For example, positions of the first to nineteenth through vias 311 to 329 may be adjusted or replaced along the second direction.

Also, two or more through vias may be electrically connected with one of the conductive layers, which are separated by the string selection line cut 13, 14, 15, or 16 and the string select line stair of the fourth region R4 and belong to the sixth conductive layer 226, through the string selection line stair of the fourth region R4 (e.g., through a corresponding upper conductive layer and a corresponding memory cell via).

The description is given with reference to FIGS. 1 and 2 that two string selection line cuts are provided along the second direction. However, the number of string selection line cuts capable of being disposed in the sixth conductive layer 226 along the second direction may be further increased. In other words, the number of string selection line cuts may be more or less than that shown in FIGS. 1-2 in order to produce more or fewer portions of the sixth conductive layer 226.

Figure 3:
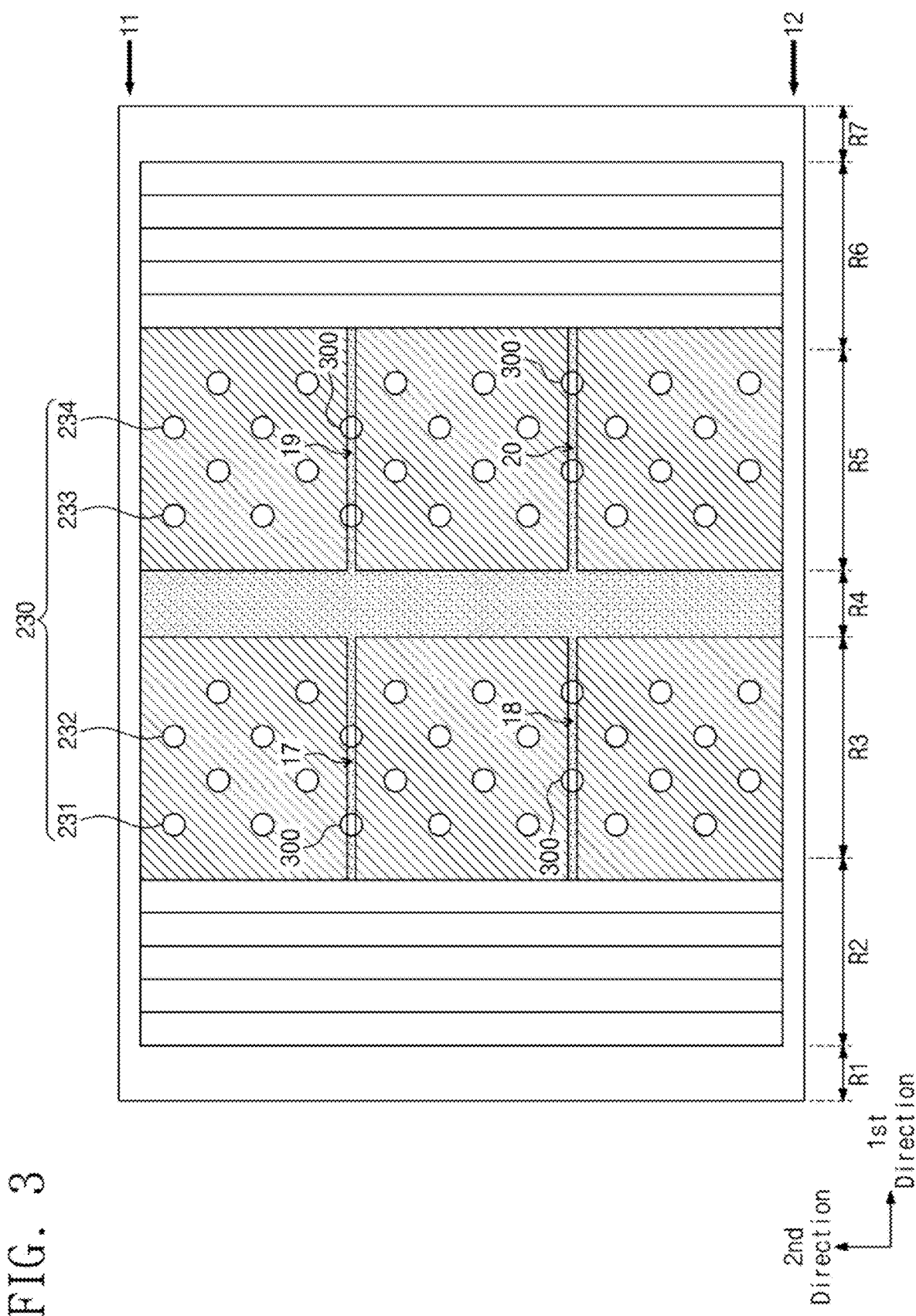
FIG. 3 illustrates a plan view according to another example of a nonvolatile memory device, according to an exemplary embodiment.

FIG. 3 illustrates a plan view according to another example of a nonvolatile memory device, according to an exemplary embodiment. The embodiment of FIG. 3 is identical to the exemplary embodiment described with reference to FIGS. 1 and 2 except for first to fourth string selection line cuts 17 to 20 and a vertical dummy channel 300. Thus, repeated description will be omitted for conciseness and to avoid redundancy. Also, elements that would make FIG. 3 unnecessarily complicated are omitted.

Referring to FIG. 3, a first string selection line cut 17, a second string selection line cut 18, a third string selection line cut 19, and a fourth string selection line cut 20 may be extend in the shape of a straight line in the first direction.

A vertical channel group including two columns of vertical channels that extend in the second direction may include 14 (or more) vertical channels. At least one of vertical channels belonging to each group may be a vertical dummy channel overlapping the first string selection line cut 17 or the third string selection line cut 19. At least another of the vertical channels belonging to each group may be a vertical dummy channel overlapping the second string selection line cut 18 or the fourth string selection line cut 20.

In the configuration in which vertical channels are disposed such that vertical dummy channels overlap a position of the string selection line cut 17, 18, 19, or 20 as illustrated in FIG. 3, a distance between the string selection line cut 17, 18, 19, or 20 and a vertical channel (except for a vertical dummy channel) that is closest to the string selection line cut 17, 18, 19, or 20 is maintained to be greater than or equal to a threshold distance. Accordingly, the string selection line cut 17, 18, 19, or 20 may not have a wave shape.

Figure 4:
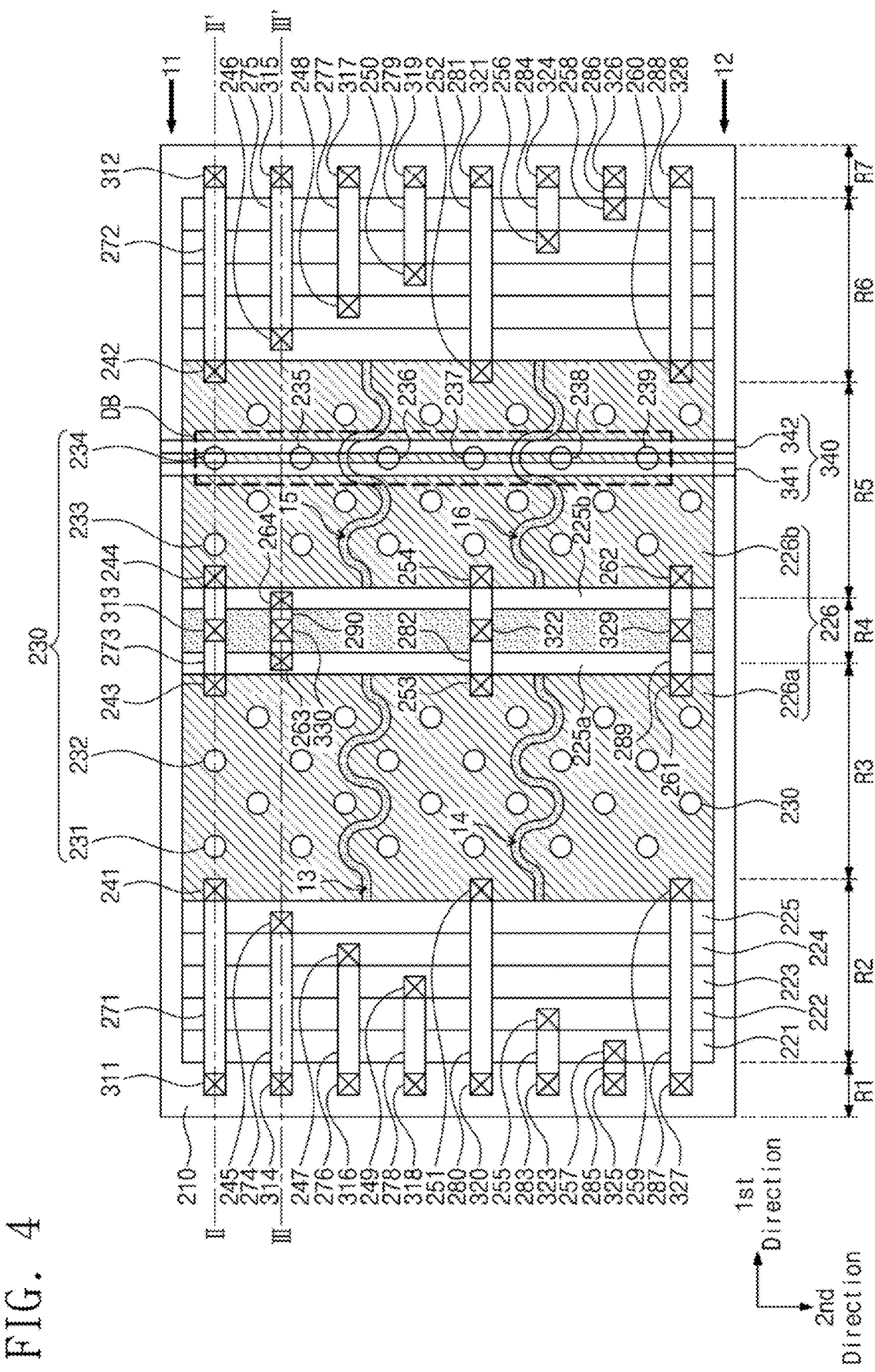
FIG. 4 illustrates a plan view according to another example of a nonvolatile memory device, according to an exemplary embodiment.
Figure 5:
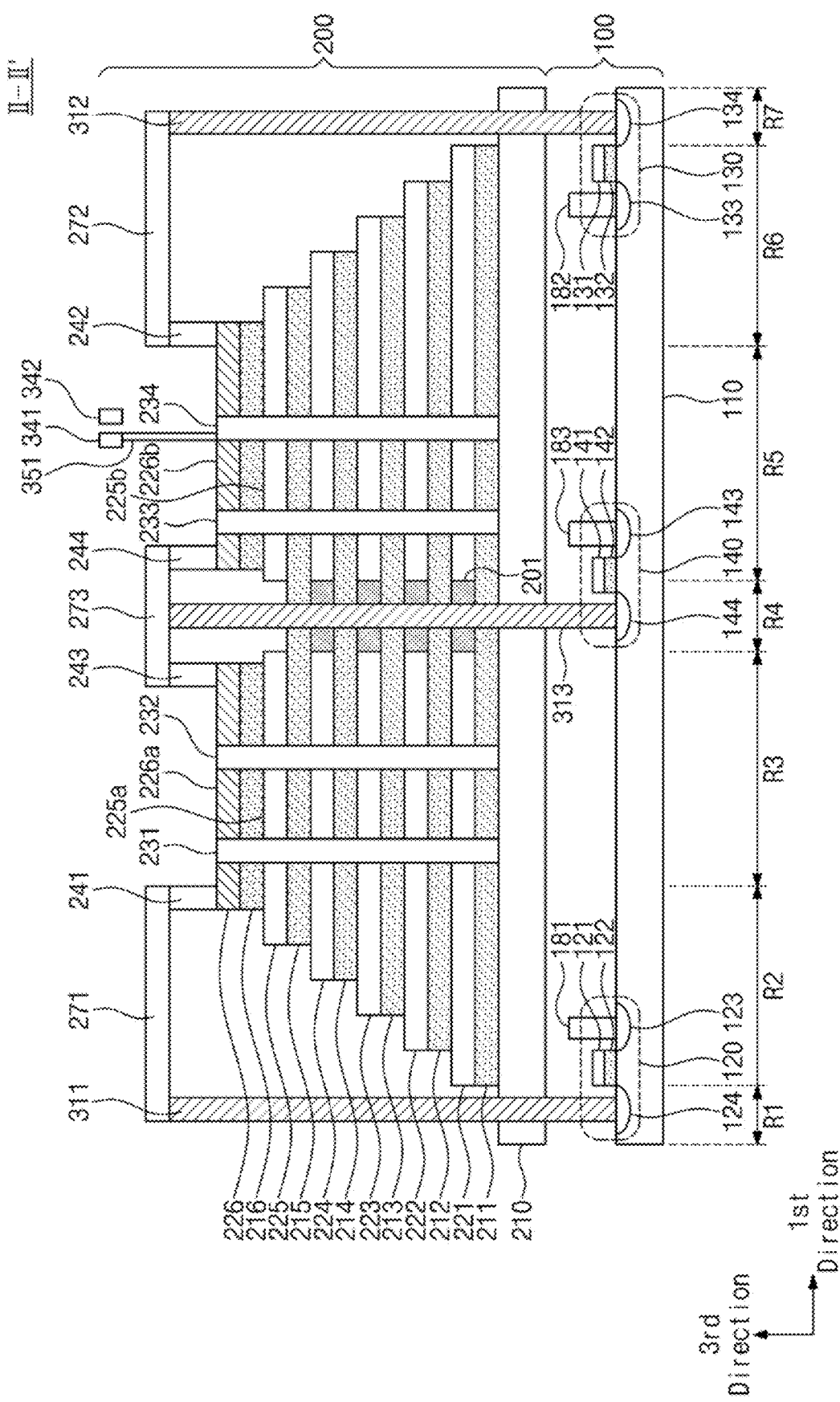
FIG. 5 is a cross-sectional view of the nonvolatile memory device of FIG. 4, taken along a line II-IF of FIG. 4.
Figure 6:
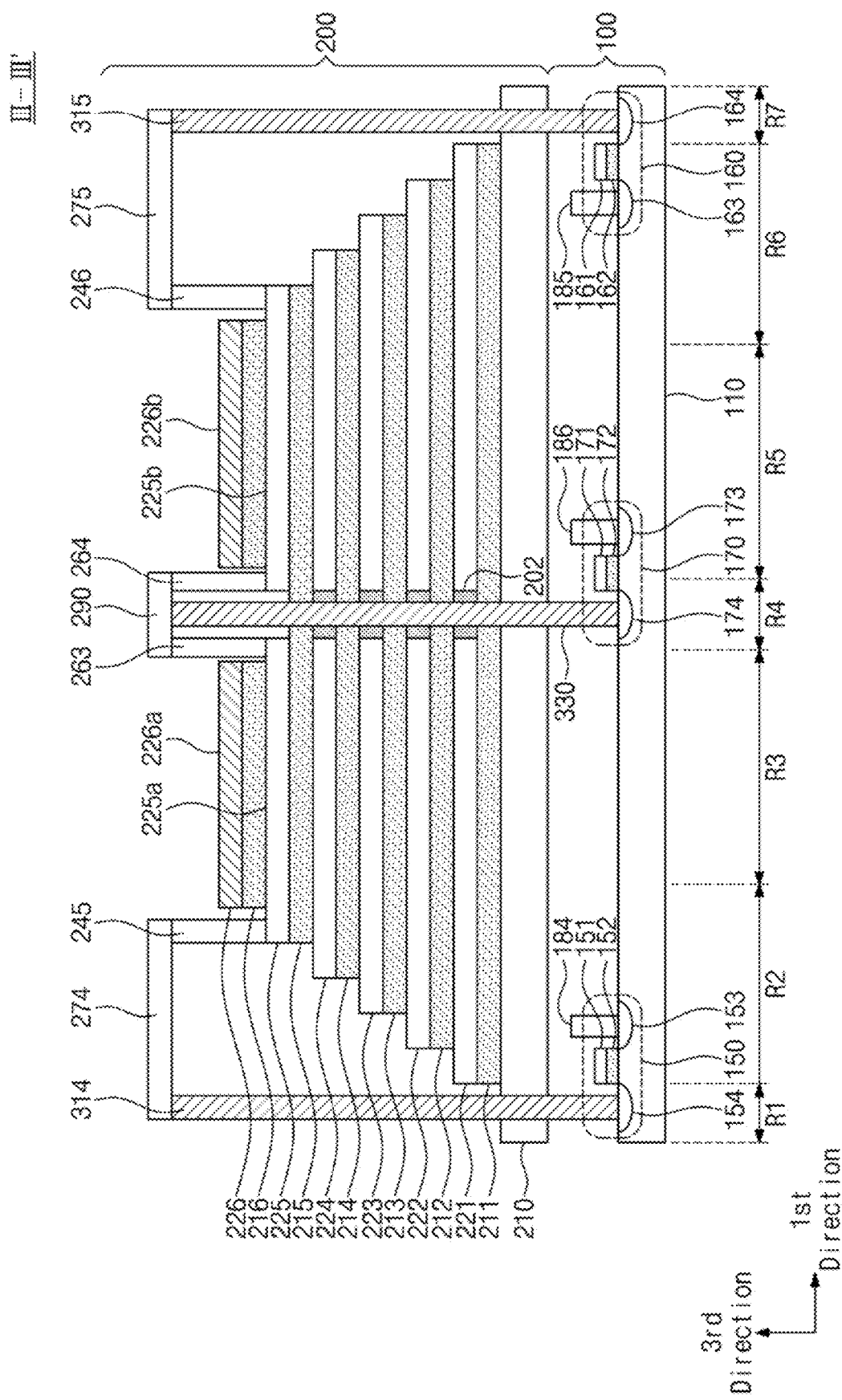
FIG. 6 is a cross-sectional view of the nonvolatile memory device of FIG. 4, taken along a line of FIG. 4.

FIG. 4 illustrates a plan view according to another example of a nonvolatile memory device, according to an exemplary embodiment. FIG. 5 is a cross-sectional view of the nonvolatile memory device taken along a line II-IF of FIG. 4. FIG. 6 is a cross-sectional view of the nonvolatile memory device taken along a line of FIG. 4. The nonvolatile memory device of FIGS. 4, 5, and 6 is identical to the nonvolatile memory device of FIGS. 1 and 2 except for a portion corresponding to the string selection line stair in the fourth region R4. Thus, repeated description will be omitted for consistency and to avoid redundancy.

Referring to FIGS. 4, 5, and 6, each of the sixth insulating layer 216 and the fifth conductive layer 225 may be divided to face each other along the first direction at the string selection line stair of the fourth region R4. The fifth conductive layer 225 may be divided into a first partial conductive layer 225a and a second partial conductive layer 225b. In other words, similar to the first and second partial conductive layer 226a and 226b described above, the first partial conductive layer 225a and the second partial conductive layer 225b may be adjacent to but spaced apart from each other in the first direction.

At the string selection line stair of the fourth region R4, a twentieth through via 330 for the fifth conductive layer 225 may be provided in addition to the third through via 313, the twelfth through via 322, and the nineteenth through via 329 for the sixth conductive layer 226. The twentieth through via 330 may be connected with a twenty-third memory cell via 263 on the first partial conductive layer 225a through a twentieth upper conductive layer 290 and with a twenty-fourth memory cell via 264 on the second partial conductive layer 225b through the twentieth upper conductive layer 290. A plurality of second insulating materials 202 may be provided between the twentieth through via 330 and the first to fourth conductive layers 221 to 224.

The peripheral circuit 100 may include a fourth pass transistor 150 supplying a voltage to a fourth through via 314, a fifth pass transistor 160 supplying a voltage to a fifth through via 315, and a sixth pass transistor 170 supplying a voltage to the twentieth through via 330.

The fourth pass transistor 150 may include a gate 151, an insulating layer 152, a first junction 153, and a second junction 154. The fifth pass transistor 160 may include a gate 161, an insulating layer 162, a first junction 163, and a second junction 164. The sixth pass transistor 170 may include a gate 171, an insulating layer 172, a first junction 173, and a second junction 174.

The first junction 153 of the fourth pass transistor 150 may be connected to a fourth peripheral circuit via 184. The fourth peripheral circuit via 184 may be connected to a wire not illustrated. The second junction 154 of the fourth pass transistor 150 may be connected to the fourth through via 314.

The first junction 163 of the fifth pass transistor 160 may be connected to a fifth peripheral circuit via 185. The fifth peripheral circuit via 185 may be connected to a wire not illustrated. The second junction 164 of the fifth pass transistor 160 may be connected to the fifth through via 315.

The first junction 173 of the sixth pass transistor 170 may be connected to a sixth peripheral circuit via 186. The sixth peripheral circuit via 186 may be connected to a wire not illustrated. The second junction 174 of the sixth pass transistor 170 may be connected to the twentieth through via 330.

The gate 151 of the fourth pass transistor 150, the gate 161 of the fifth pass transistor 160, and the gate 171 of the sixth pass transistor 170 may be connected to a common wire. The fourth peripheral circuit via 184, the fifth peripheral circuit via 185, and the sixth peripheral circuit via 186 may be connected to a common wire.

That is, the fourth pass transistor 150, the fifth pass transistor 160, and the sixth pass transistor 170 may respectively transfer a common voltage of a common wire to the fourth through via 314, the fifth through via 315, and the twentieth through via 330 in response to a common control signal.

Because the fifth conductive layer 225 is not divided by the string selection line cut 13, 14, 15, or 16, one through via is provided at the string selection line stair of the fourth region R4, thus making it possible to apply a voltage to the fifth conductive layer 225 that is stronger than a voltage applied to the first through fourth conductive layers 221-224. However, at the string selection line stair of the fourth region R4, there may be provided two or more through vias for the fifth conductive layer 225, and thus, the first partial conductive layer 225a and the second partial conductive layer 225b may be electrically connected (e.g., through corresponding upper conductive layers and corresponding memory cell vias). FIGS. 4-6 illustrate that the fifth conductive layer 225 is spaced apart in the first direction. However, this is only an example and the concept of FIGS. 4-6 may be extended to other conductive layers 221-224. In other words, in some exemplary embodiments, one or more additional ones of the conductive layers 221-224 may be spaced apart in the first direction and configured similar to the conductive layer 225.

Figure 7:
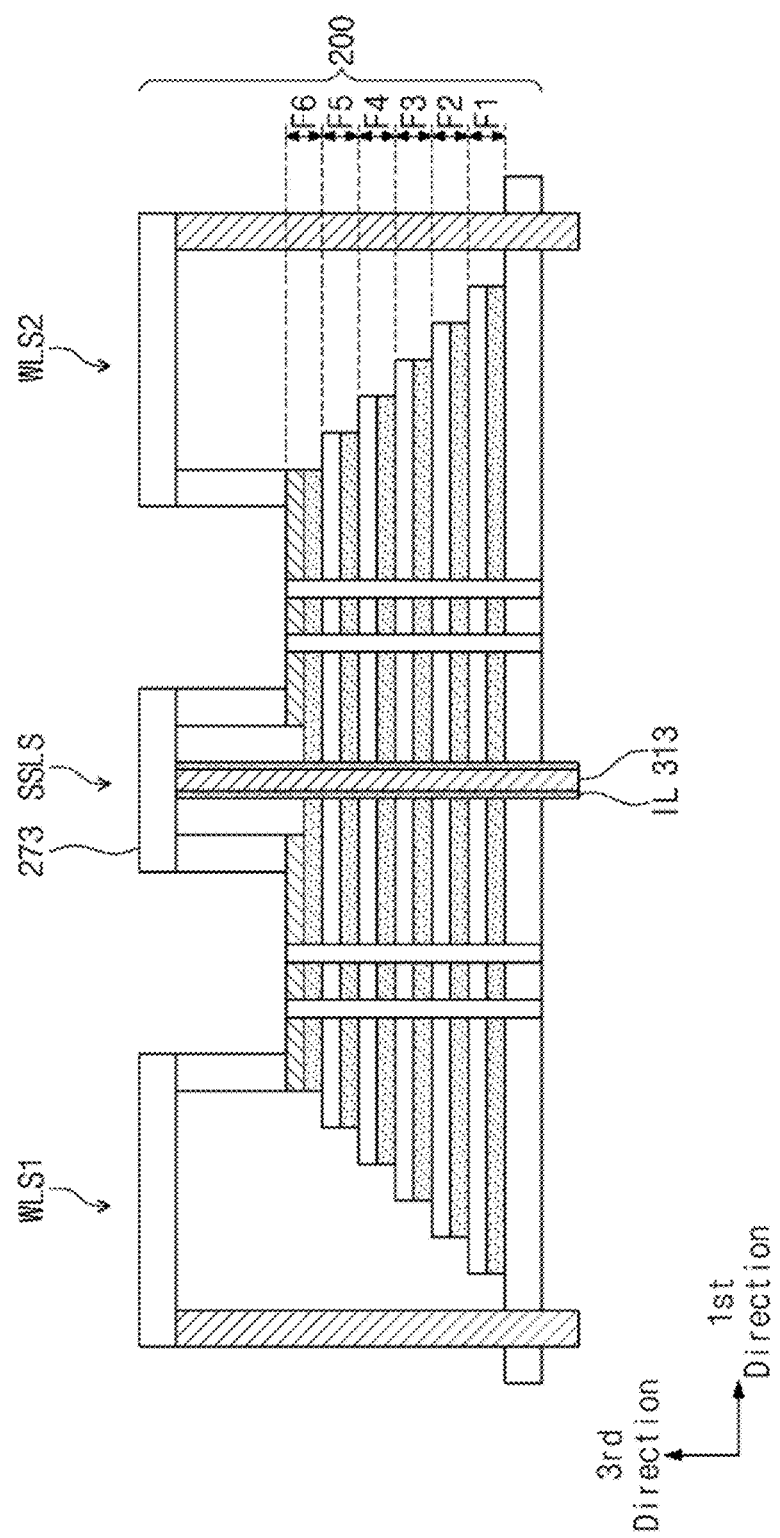
FIG. 7 illustrates another example of a cross-sectional view of a memory block.

FIG. 7 illustrates another example of a cross-sectional view of the memory block 200, according to an exemplary embodiment. The cross-sectional view of FIG. 7 is identical to the cross-sectional view of the memory block 200 of FIG. 2 except for the third through via 313. Thus, the same reference numerals are used, and repeated description thereof will be omitted for conciseness and to avoid redundancy.

Referring to FIG. 7, a vertical structure may be disposed between a first word line stair WLS1 and a second word line stair WLS2. A pair of an insulating layer and a conductive layer may form one floor of the stair. The vertical structure may include a first floor F1, a second floor F2, a third floor F3, a fourth floor F4, and a fifth floor F5. A sixth floor F6 for implementing a string selection line stair SSLS may be placed on the vertical structure.

The third through via 313 of the string selection line stair SSLS may be electrically insulated from conductive layers of the first to fifth floors F1 to F5 by an insulating layer IL surrounding the third through via 313. In some exemplary embodiments, the insulating layer IL may surround the third through via 313 only until a particular point between the fifth floor F5 and the third upper conductive layer 273 along the third direction.

In some exemplary embodiments, as described with reference to FIGS. 4, 5, and 6, two or more of the conductive layers may be spaced apart from each other to face each other along the first direction, and thus, the string selection line stair SSLS may be expanded. It is noted that in the exemplary embodiment shown in FIG. 7, only the conductive layer of the sixth floor is shown spaced apart in the first direction.

Figure 8:
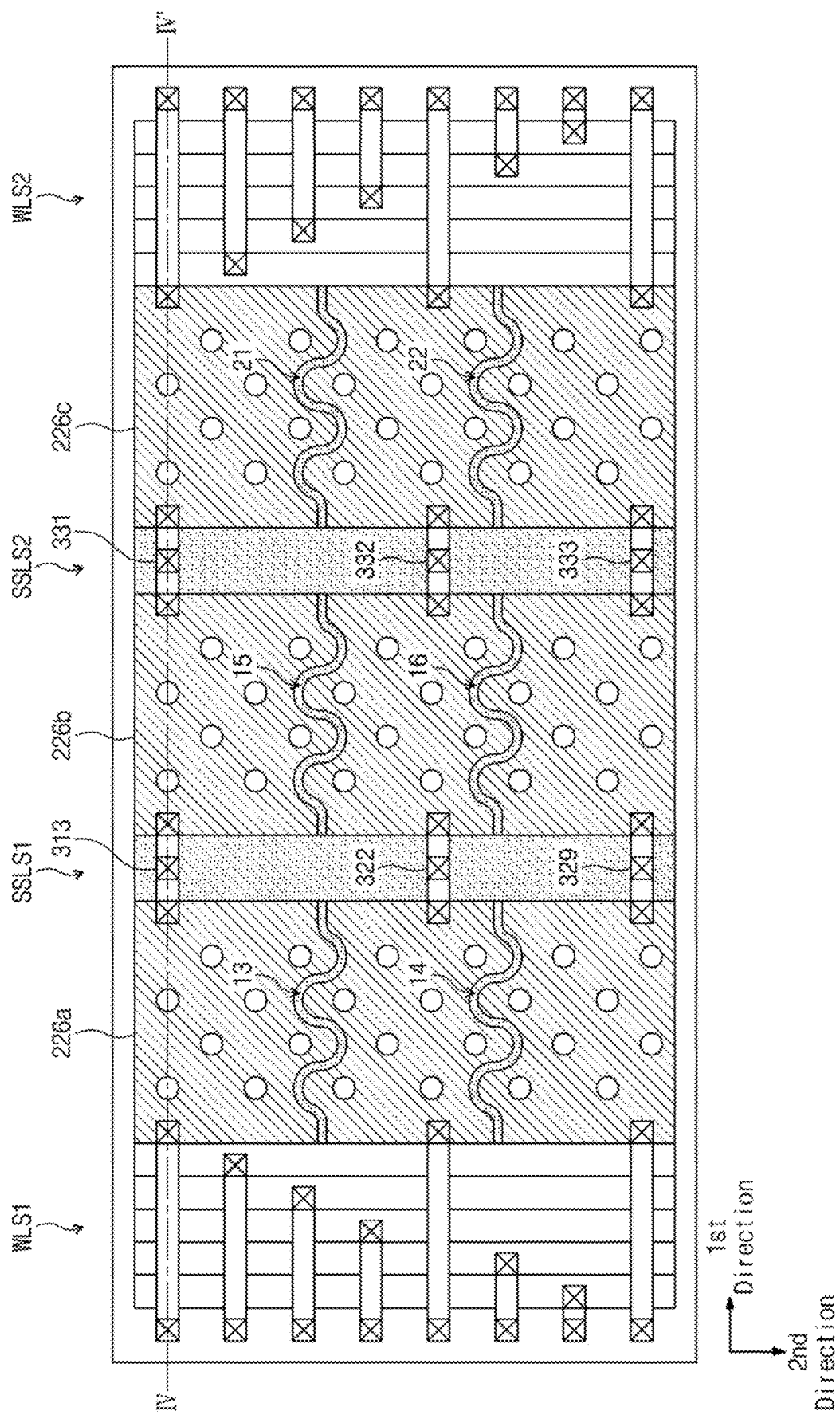
FIG. 8 is a plan view of another example of a nonvolatile memory device, according to an exemplary embodiment.
Figure 9:
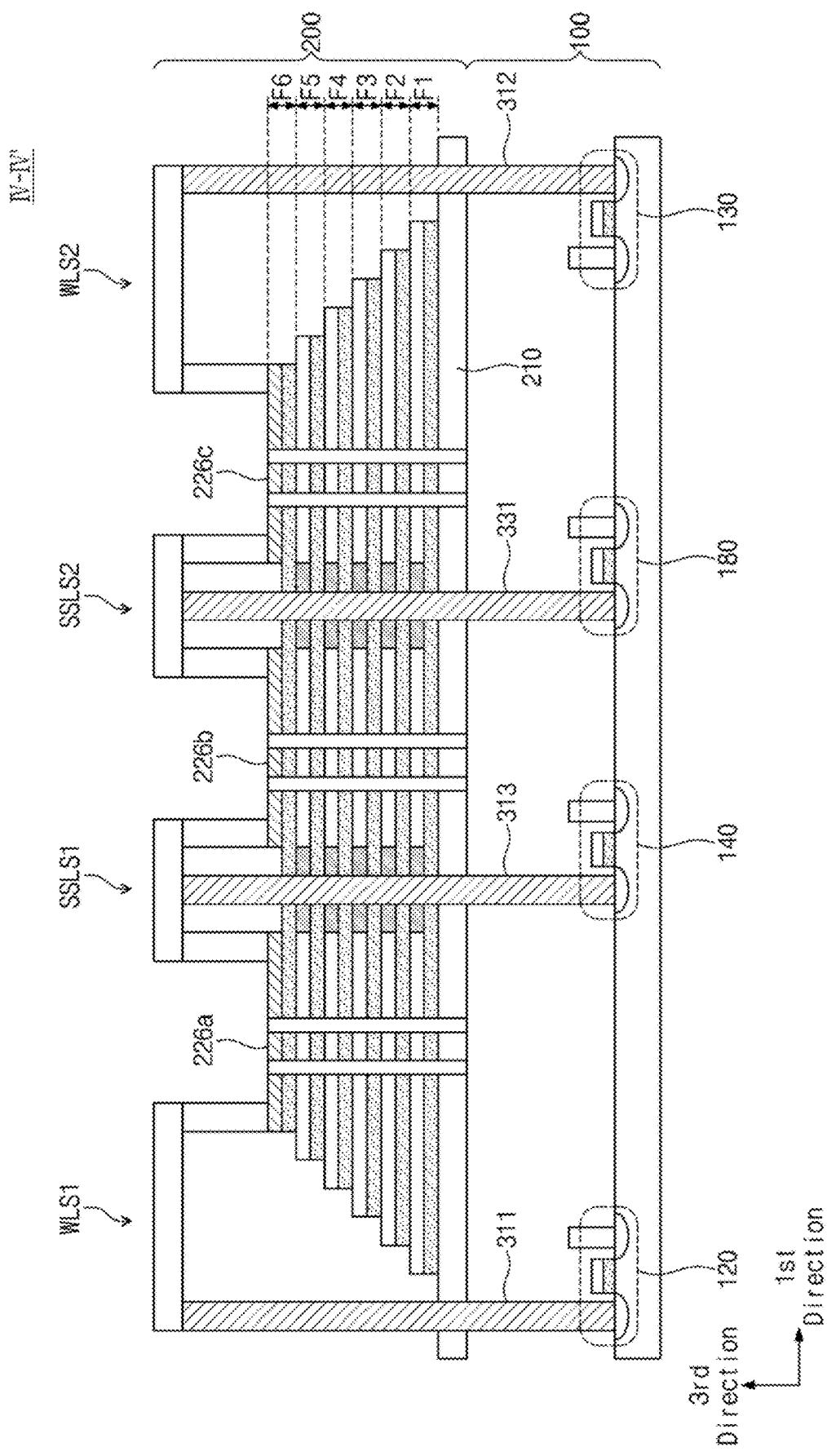
FIG. 9 is a cross-section view of the nonvolatile memory device of FIG. 8, taken along a line IV-IV' of FIG. 8.

FIG. 8 is a plan view of another example of a nonvolatile memory device, according to an exemplary embodiment. FIG. 9 is a cross-section view of a nonvolatile memory device taken along a line IV-IV' of FIG. 8. A memory block of FIGS. 8 and 9 is identical to the memory block 200 of FIGS. 1 and 2 except that a first string selection line stair SSLS1 and a second selection line stair SSLS2 and through vias 313 and 331 corresponding to the string selection line stairs SSLS1 and SSLS2 are provided. Thus, the same reference numerals are used, and repeated description thereof will be omitted for conciseness and to avoid redundancy.

Referring to FIGS. 8 and 9, a conductive layer (e.g., the sixth conductive layer 226) of the sixth floor F6 may be divided into a first partial conductive layer 226a, a second partial conductive layer 226b, and a third partial conductive layer 226c by the first string selection line stair SSLS1 and the second string selection line stair SSLS2. That is, the conductive layer of the sixth floor F6 may be divided into 9 conductive layers by the first and second string selection line stairs SSLS1 and SSLS2 and the string selection line cuts 13, 14, 15, 16, 21, and 22.

Similar to in the fourth region R4 of FIGS. 1 and 2, the third through via 313, the twelfth through via 322, and the nineteenth through via 329 may be provided at the first string selection line stair SSLS1. Each of the third through via 313, the twelfth through via 322, and the nineteenth through via 329 may be connected to a corresponding conductive layer of conductive layers belonging to the first partial conductive layer 226a (i.e., conductive layers divided by the string selection line cuts 13 and 14) and a corresponding conductive layer of conductive layers belonging to the second partial conductive layer 226b (i.e., conductive layers divided by the string selection line cuts 15 and 16) through a corresponding upper conductive layer and corresponding memory cell vias, as illustrated in FIG. 8.

Each of the third through via 313, the twelfth through via 322, and the nineteenth through via 329 may penetrate the vertical structure and the second active region 210 and may be electrically connected to a corresponding pass transistor (e.g., 140) of the peripheral circuit 100, as illustrated in FIG. 9.

A twenty-first through via 331, a twenty-second through via 332, and a twenty-third through via 333 may be provided at the second string selection line stair SSLS2. Each of the twenty-first through via 331, the twenty-second through via 332, and the twenty-third through via 333 may be connected to a corresponding conductive layer of the conductive layers belonging to the second partial conductive layer 326b (i.e., the conductive layers divided by the string selection line cuts 15 and 16) and a corresponding conductive layer of conductive layers belonging to the third partial conductive layer 326c (i.e., conductive layers divided by the string selection line cuts 21 and 22) through a corresponding upper conductive layer and corresponding memory cell vias, as illustrated in FIG. 8.

Each of the twenty-first through via 331, the twenty-second through via 332, and the twenty-third through via 333 may penetrate the vertical structure and the second active region 210 and may be electrically connected to the corresponding pass transistor (e.g., 180) of the peripheral circuit 100, as illustrated in FIG. 9. FIGS. 8-9 illustrate that two string selection line stairs SSLS1 and SSLS2. However, this is only an example and the concept of FIGS. 8-9 may be extended to additional string selection line stairs along the first direction. In other words, in some exemplary embodiments, two or more string selection line stairs may be provided and configured similarly to the string selection line stairs SSLS1 and SSLS2 in FIGS. 8-9.

As described with reference to FIGS. 8 and 9, two or more string selection line stairs may be provided along the first direction. When two or more string selection line stairs are provided, each of conductive layers divided by the string selection line stairs and the string selection line cuts may be supplied with a voltage through corresponding pass transistors.

The conductive layer of the sixth floor F6 may be divided into a plurality of conductive layers by the string selection line cuts 13, 14, 15, 16, 21, and 22, and the divided conductive layers may be electrically connected through upper conductive layers and memory cell vias to form conductive lines extended along the first direction. As described with reference to FIGS. 1 and 2, when one string selection line stair is provided, the divided conductive lines of the conductive layer of the sixth floor F6 are supplied with a voltage from three pass transistors.

As described with reference to FIGS. 8 and 9, when two string selection line stairs are provided, the divided conductive lines of the conductive layer of the sixth floor F6 are supplied with a voltage from four pass transistors. That is, when "k" string selection line stairs (k being a positive integer) are provided, the divided conductive lines are supplied with a voltage from (k+2) pass transistors.

In some exemplary embodiments, the total number of vertical channels penetrating the vertical structure may be "n". When "i" string selection line cuts are provided along the second direction and "j" string selection line stairs are provided along the first direction, the number of vertical channels "m" belonging to each of the divided conductive layers that are divided by the string selection line cuts and the string selection line stairs may be calculated by Equation 1 below.

$$m = n/(i+1) \times (j+1) \quad \text{[Equation 1]}$$

As described with reference to FIGS. 4, 5, and 6, string selection line cut(s) may not be provided at a particular layer (e.g., the fifth conductive layer 225 in FIGS. 4-6), and a string selection line stair(s) may be provided. In such a configuration, the number of vertical channels belonging to each of the divided conductive layers divided by the string selection line stair(s) at the corresponding layer may be "n/(j+1)".

Because the vertical structure is formed in the shape of a stair, a length in the first direction of each of the divided conductive layers divided by the string selection line stair(s) may be "1/(j+1)" times a length in the first direction of each of the conductive layers not divided by the string selection line stair(s).

Figure 10:
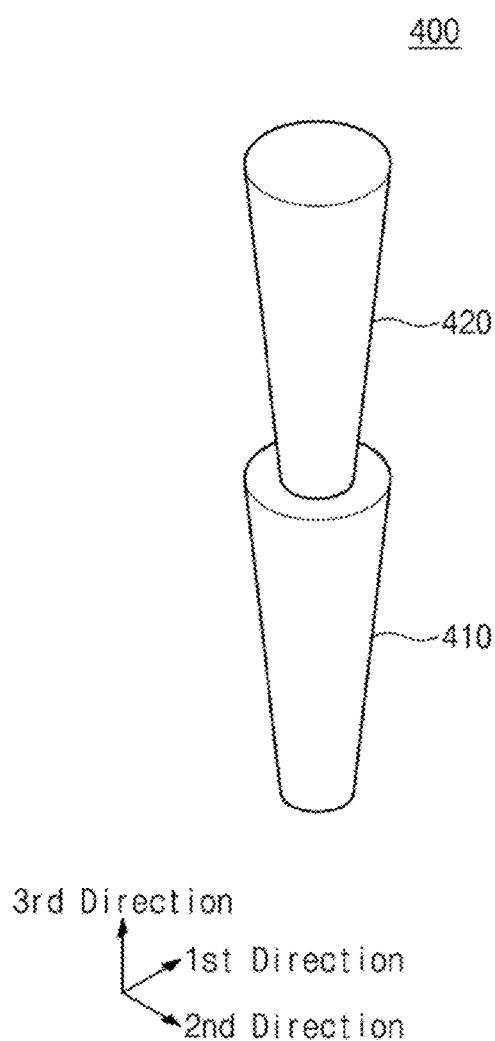
FIG. 10 illustrates a shape of an exemplary through via, according to an exemplary embodiment.

FIG. 10 illustrates a shape of a through via 400, according to an exemplary embodiment. Referring to FIGS. 1, 2, and 10, due to a distinct characteristic of a process, since the through via 400 extends in the third direction, the cross-sectional area of a through via (e.g., 410 or 420) (i.e., the cross-sectional area of a plane defined by the first direction and the second direction) increases in the third direction, as illustrated in FIG. 10. Also, because a depth of a hole capable of being formed at once is limited, the through via 400 may include two or more layers 410 and 420. The cross-sectional area of each of the two or more layers 410 and 420 may increase in the third direction.

In some exemplary embodiments, a shape of the through via 400 may be identically applied to other structures that extend in the third direction, for example, at least one of a peripheral circuit via, a vertical channel, and a memory cell via.

In some exemplary embodiments, in a 92-layered vertical structure, the cross-sectional area of the uppermost portion of vertical channels may be greater than the cross-sectional area of the lowermost portion thereof by as much as 25%. In contrast, a length in the first direction of the lowermost conductive layer (e.g., 221) in the 92-layered vertical structure may be greater than a length in the first direction of the uppermost conductive layer (e.g., 251) therein by as much as 7%.

As the cross-sectional area of the vertical channels increases, the cross-sectional area of a conductive layer at the corresponding layer, for example, the cross-sectional area of a plane defined the second direction and the third direction decreases. The decrease in the cross-sectional area causes a decrease in conductivity of the conductive layer. The degree by which a resistance increases as a height of the vertical structure increases (i.e., an increase of resistance due to an increase in the cross-sectional area of vertical channels) may be greater than the degree by which a resistance decreases as a height of the vertical structure increases (i.e., a decrease of resistance due to a decrease in a length of a conductive layer in the first direction).

To compensate for the increase in resistance and improve the performance of a nonvolatile memory device, as described with reference to FIGS. 4, 5, and 6, a structure may be provided in which a resistance decreases by expanding a string selection line stair up to an upper layer of a vertical structure.

Figure 11:
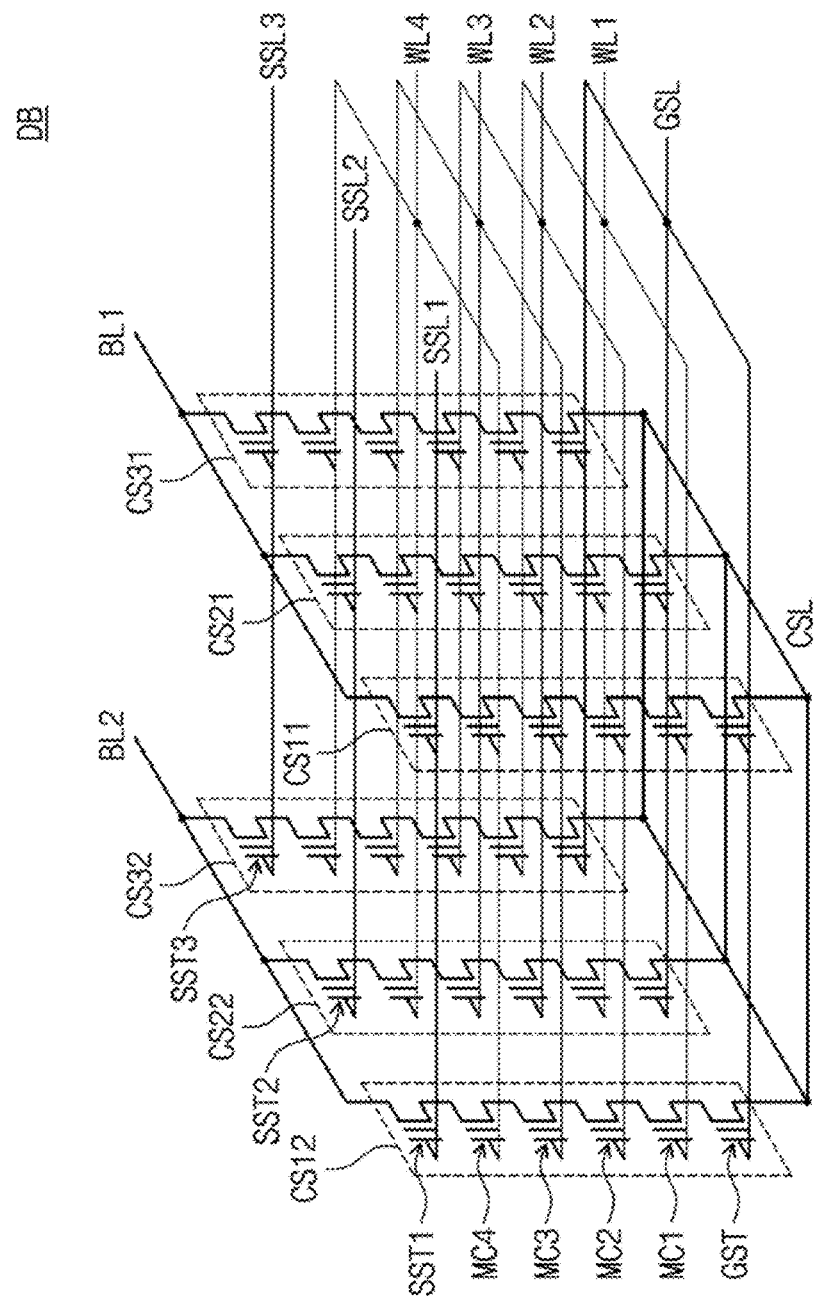
FIG. 11 illustrates an example of a circuit diagram corresponding to a dotted line box of FIG. 1.

FIG. 11 illustrates an example of a circuit diagram corresponding to a dotted line box DB of FIG. 1. Referring to FIGS. 1, 2, and 11, a plurality of cell strings CS11, CS12, CS21, CS22, CS31, and CS32 may be disposed on the second active region 210. The plurality of cell strings CS11, CS12, CS21, CS22, CS31, and CS32 may be connected in common to a common source line CSL formed on (or in) the second active region 210.

The cell strings CS11, CS21, and CS31 may be connected to a first bit line BL1, and the cell strings CS12, CS22, and CS32 may be connected to a second bit line BL2. For example, the first bit line BL1 may correspond to one (e.g., the first conductive line 341) of the first and second conductive lines 341 and 342, and the second bit line BL2 may correspond to the other (e.g., the second conductive line 342) of the first and second conductive lines 341 and 342.

The cell strings CS11, CS21, and CS31 may correspond to the odd-numbered vertical channels 234, 236, and 238 along the second direction. The cell strings CS12, CS22, and CS3 may correspond to the even-numbered vertical channels 235, 237, and 239 along the second direction.

The vertical channels 234 to 239 may be disposed in line along the second direction. However, to prevent FIG. 11 from being unnecessarily complicated, the cell strings CS11, CS12, CS21, CS22, CS31, and CS32 are illustrated in FIG. 11 in a plurality of rows and a plurality of columns. In some exemplary embodiments, a direction in which the bit lines BL1 and BL2 extend may be a column direction, and a direction in which string selection lines SSL1, SSL2, and SSL3 extend may be a row direction. That is, the vertical channels 234 to 239 are illustrated in FIG. 11 in a matrix of three rows by two columns.

Cell strings of each row may be connected in common to a ground selection line GSL and may be connected to the corresponding string selection line of first to third string selection lines SSL1 to SSL3. Cell strings of each column may be connected to the corresponding bit line of the first and second bit lines BL1 and BL2.

Each cell string may include at least one ground selection transistor GST connected to the ground selection line GSL, a plurality of memory cell transistors MC1 to MC4 respectively connected to a plurality of word lines WL1 to WL4, and a string selection transistor SST1, SST2, or SST3 connected to the corresponding string selection line SSL1, SSL2, or SSL3.

The ground selection transistors GST may correspond to portions adjacent to the vertical channels 234 to 239 from among the vertical channels 234 to 239 and the first conductive layer 221. The ground selection line GSL may correspond to the first conductive layer 221. Likewise, the first to fourth memory cell transistors MC1 to MC4 and the word lines WL1 to WL4 may correspond to the second to fifth conductive layers 222 to 225 and the vertical channels 234 to 239, respectively.

The first string selection line SSL1 may correspond to conductive layers (i.e., conductive layers third placed along the second direction) divided by the second and fourth string selection line cuts 14 and 16 from among conductive layers (i.e., conductive layers divided by the first to fourth string selection line cuts 13 to 16 and the string selection line stair) belonging to the sixth conductive layer 226.

The second string selection line SSL2 may correspond to conductive layers (i.e., conductive layers second placed along the second direction) divided by the first to fourth string selection line cuts 13 to 16 from among the conductive layers (i.e., the conductive layers divided by the first to fourth string selection line cuts 13 to 16 and the string selection line stair) belonging to the sixth conductive layer 226.

The third string selection line SSL3 may correspond to conductive layers (i.e., conductive layers first placed along the second direction) divided by the first and third string selection line cuts 13 and 15 from among the conductive layers (i.e., the conductive layers divided by the first to fourth string selection line cuts 13 to 16 and the string selection line stair) belonging to the sixth conductive layer 226.

An example is described with reference to FIGS. 1 to 11 in which the number of cell transistors included in one cell string is "6". However, the number of cell transistors included in one cell string is not limited. As the number of layers of the vertical structure increases, the number of cell transistors included in one cell string may increase.

Also, the number of cell transistors to be used as a ground selection transistor, a memory cell transistor, or a string selection transistor from among cell transistors belonging to one cell string may be variable. A part of cell transistors belonging to one cell string may be used as dummy memory cell transistors that do not store data.

Figure 12:
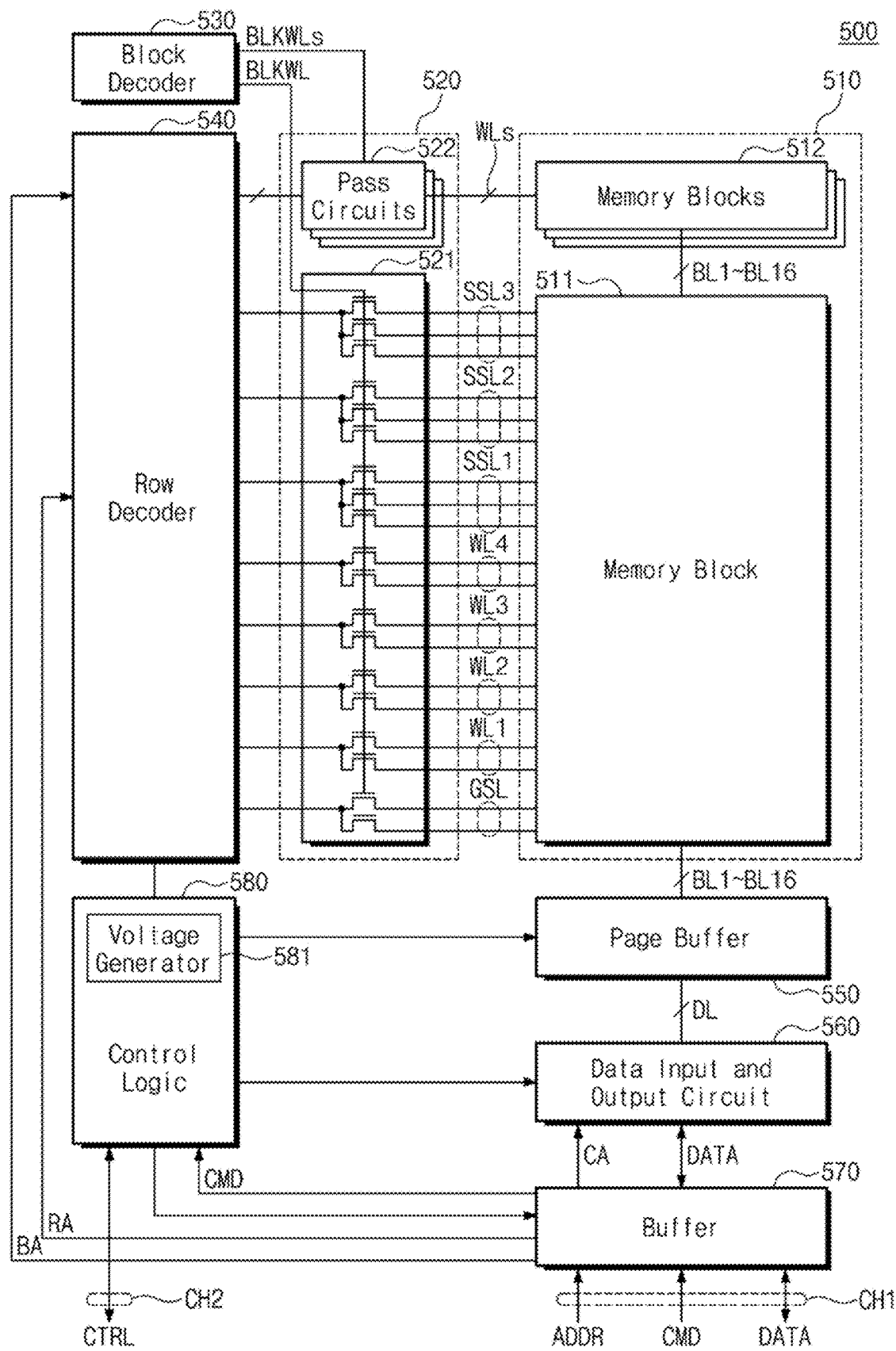
FIG. 12 is a block diagram illustrating a nonvolatile memory device according to an exemplary embodiment.

FIG. 12 is a block diagram illustrating a nonvolatile memory device 500 according to an exemplary embodiment. Referring to FIG. 12, the nonvolatile memory device 500 includes a memory cell array 510, a pass circuit unit 520, a block decoder 530, a row decoder 540, a page buffer 550, a data input and output circuit 560, a buffer 570, and control logic 580.

The memory cell array 510 includes a plurality of memory blocks 511 and 512. Each of the memory blocks 511 and 512 includes memory cells. For example, each of the memory blocks 511 and 512 may include the memory block 200 described with reference to FIGS. 1 to 11. The memory block 200 may be repeatedly provided along the second direction and may correspond to the plurality of memory blocks 511 and 512.

As described with reference to FIGS. 1, 2, 11, and 12, each memory block (e.g., 511) may be connected to the ground selection line GSL, the first to fourth word lines WL1 to WL4, and the first to third string selection lines SSL1 to SSL3. Each of the memory blocks 511 and 512 may be connected to the page buffer 550 through a plurality of bit lines BL.

In the example of the structure of FIGS. 1 and 2, the bit lines BL may include first to sixteenth bit lines BL1 to BL16. The plurality of memory blocks 511 and 512 may be connected in common to the plurality of bit lines BL. For example, the first and second conductive lines 341 and 342 may be extended in the second direction and may be connected in common to the plurality of memory blocks 511 and 512.

In an exemplary embodiment, each of the plurality of memory blocks 511 and 512 may correspond to a unit of an erase operation. The memory cells belonging to each of the memory blocks 511 and 512 may be erased at the same time. For another example, each of the plurality of memory blocks 511 and 512 may be divided into a plurality of sub-blocks. Each of the plurality of sub-blocks may correspond to a unit of an erase operation.

The pass circuit unit 520 may include a plurality of pass circuits 521 and 522 respectively corresponding to the plurality of memory blocks 511 and 512. In an exemplary embodiment, there is illustrated a structure of one pass circuit 521 corresponding to one memory block 511.

The ground selectin line GSL and the first to fourth word lines WL1 to WL4 may respectively correspond to the first to fifth conductive layers 221 to 225. Each of the ground selection line GSL and the first to fourth word lines WL1 to WL4 may be connected to two pass transistors through two through vias at word line stairs placed on opposite sides thereof. That is, the pass circuit 521 may include two pass transistors for each of the ground selection line GSL and the first to fourth word lines WL1 to WL4.

The first to third string selection lines SSL1 to SSL3 may correspond to the sixth conductive layer 226. Each of the first to third string selection lines SSL1 to SSL3 may be connected to three pass transistors through three through vias at word line stairs placed on opposite sides thereof and a string selection line stair placed on the center thereof. That is, the pass circuit 521 may include three pass transistors for each of the first to third string selection lines SSL1 to SSL3.

The block decoder 530 is connected to block word lines BLKWL and BLKWLs. The block decoder 530 may operate under control of the control logic 580. The block decoder 530 may decode a block address BA received from the buffer 570. The block decoder 530 may activate a block word line (e.g., BLKWL), which the block address BA indicates, from among the block word lines BLKWL and BLKWLs and may turn on pass transistors of the pass circuit 521 connected to the block word line BLKWL.

When the pass transistors of the pass circuit 521 are turned on, the ground selection line GSL, the first to fourth word lines WL1 to WL4, and the first to third string selection lines SSL1 to SSL3 of the memory block 511 connected to the pass circuit 521 may be connected to the row decoder 540.

The row decoder 540 is connected to the memory block 511 through the pass circuit 521, the ground selection line GSL, the first to fourth word lines WL1 to WL4, and the first to third string selection lines SSL1 to SSL3. The row decoder 540 operates under control of the control logic 580.

The row decoder 540 may decode a row address RA received from the buffer 570 and may control voltages to be applied to the ground selection line GSL, the first to fourth word lines WL1 to WL4, and the first to third string selection lines SSL1 to SSL3 depending on the decoded row address.

The page buffer 550 is connected to the memory cell array 510 through the first to sixteenth bit lines BL1 to BL16. The page buffer 550 is connected with the data input and output circuit 560 through data lines DL. The page buffer 550 operates under control of the control logic 580.

In a write operation, the page buffer 550 may write data to be written into memory cell transistors. The page buffer 550 may apply voltages to the first to sixteenth bit lines BL1 to BL16 based on the stored data. In a read operation or in a verification read operation that is performed in a write operation or an erase operation, the page buffer 550 may sense voltages of the first to sixteenth bit lines BL1 to BL16 and may store a result of the sensing.

The data input and output circuit 560 is connected with the page buffer 550 through the plurality of data lines DL. The data input and output circuit 560 may receive a column address CA from the buffer 570. The data input and output circuit 560 may output data read by the page buffer 550 to the buffer 570 depending on the column address CA. The data input and output circuit 560 may transfer data received from the buffer 570 to the page buffer 550, based on the column address CA.

The buffer 570 may receive a command CMD and an address ADDR from an external device through a first channel CH1 and may exchange data "DATA" with the external device. The buffer 570 may operate under control of the control logic 580. The buffer 570 may transfer the command CMD to the control logic 580. The buffer 570 may transfer the block address BA of the address ADDR to the block decoder 530 and may transfer the column address CA of the address ADDR to the data input and output circuit 560. The buffer 570 may exchange the data "DATA" with the data input and output circuit 560.

The control logic 580 may exchange a control signal CTRL with the external device through a second channel CH2. The control logic 580 may allow the buffer 570 to route the command CMD, the address ADDR, and the data "DATA". The control logic 580 may decode the command CMD received from the buffer 570 and may control the nonvolatile memory device 500 depending on the decoded command.

The control logic 580 may include a voltage generator 581. The voltage generator 581 may generate various voltages to be applied to the ground selection line GSL, the first to fourth word lines WL1 to WL4, and the first to third string selection lines SSL1 to SSL3. The control logic 580 may transfer various voltages generated by the voltage generator 581 to the row decoder 540.

According to various exemplary embodiments, a voltage is applied to two divided conductive layers through a through via between the two divided conductive layers. For example, the block decoder 530 under the control of the control logic 580 (specifically the voltage generator 581) may turn on pass transistors of the pass circuit 521 to supply the voltage to the two divided conductive layers by the through vias (e.g., the third through via 313). The voltage may be higher than a voltage applied to other conductive layers. Accordingly, there is provided a nonvolatile memory device that prevents the reduction of performance by applying a voltage to some of stacked conductive layers more strongly.

Figure 13:
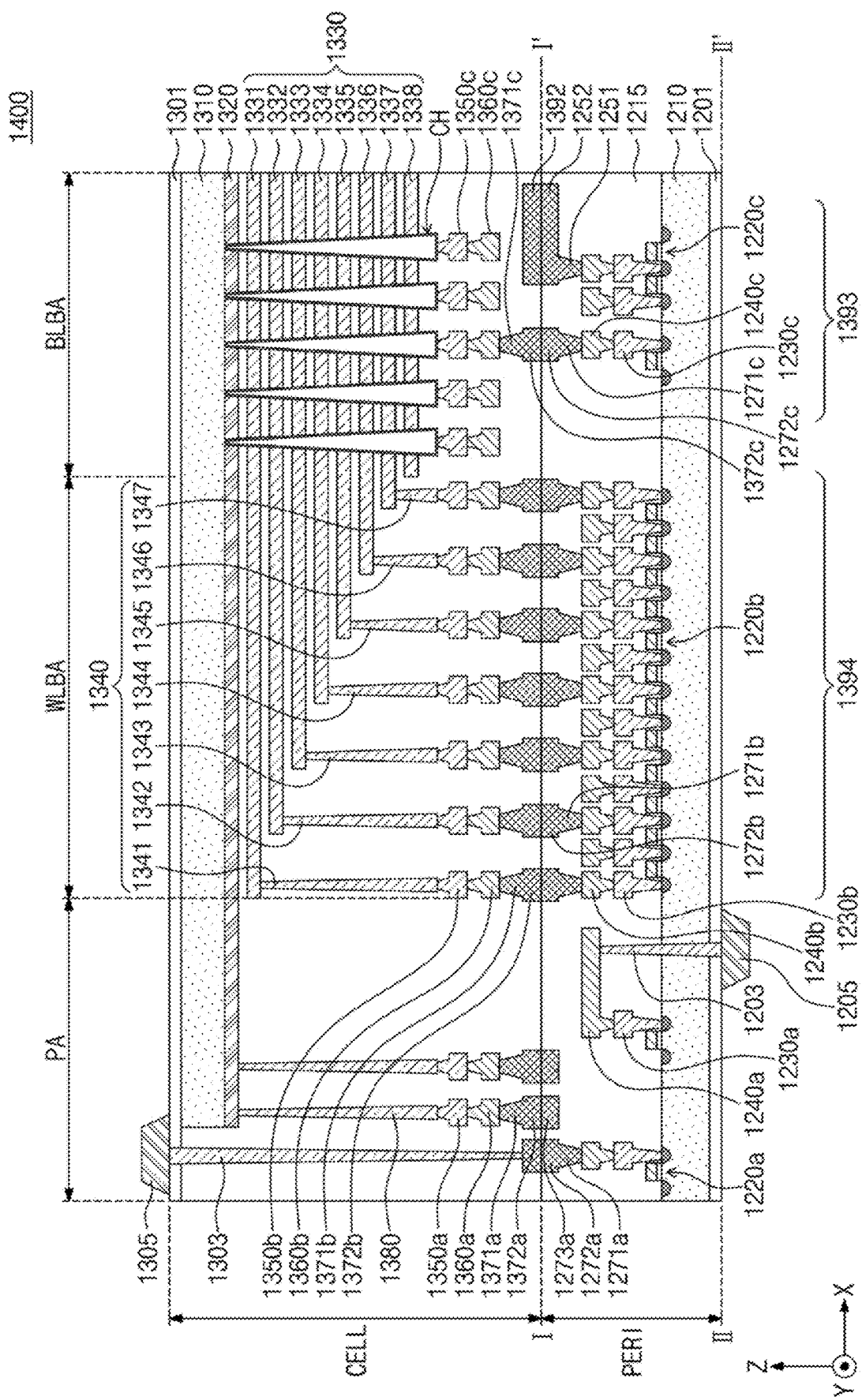
FIG. 13 is a diagram illustrating an exemplary nonvolatile memory device.

FIG. 13 is a diagram illustrating an exemplary nonvolatile memory device 1400. Referring to FIG. 13, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 2 1210, first metal layers 1230a, 1230b, and 1230c respectively connected to the plurality of circuit elements 1220a, 1220b, and 1220c, and second metal layers 2 1240a, 2 1240b, and 2 1240c formed on the first metal layers 2 1230a, 2 1230b, and 2 1230c. In an example embodiment, the first metal layers 2 1230a, 2 1230b, and 2 1230c may be formed of tungsten having relatively high resistance, and the second metal layers 2 1240a, 2 1240b, and 2 1240c may be formed of copper having relatively low resistance.

In an example embodiment illustrate in FIG. 13, although the first metal layers 2 1230a, 2 1230b, and 2 1230c and the second metal layers 2 1240a, 2 1240b, and 2 1240c are shown and described, they are not limited thereto, and one or more metal layers may be further formed on the second metal layers 2 1240a, 2 1240b, and 2 1240c. At least a portion of the one or more metal layers formed on the second metal layers 2 1240a, 2 1240b, and 2 1240c may be formed of aluminum or the like having a lower resistance than those of copper forming the second metal layers 2 1240a, 2 1240b, and 2 1240c.

The interlayer insulating layer 2 1215 may be disposed on the first substrate 2 1210 and cover the plurality of circuit elements 2 1220a, 2 1220b, and 2 1220c, the first metal layers 2 1230a, 2 1230b, and 2 1230c, and the second metal layers 2 1240a, 2 1240b, and 2 1240c. The interlayer insulating layer 2 1215 may include an insulating material such as silicon oxide, silicon nitride, or the like.

Lower bonding metals 2 1271b and 2 1272b may be formed on the second metal layer 2 1240b in the word line bonding area WLBA. In the word line bonding area WLBA, the lower bonding metals 2 1271b and 2 1272b in the peripheral circuit region PERI may be electrically connected to upper bonding metals 3 1371b and 3 1372b in the cell region CELL in a bonding manner, and the lower bonding metals 2 1271b and 2 1272b and the upper bonding metals 3 1371b and 3 1372b may be formed of aluminum, copper, tungsten, or the like.

Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. The cell region CELL may include a second substrate 3 1310 and a common source line 3 1320. On the second substrate 3 1310, a plurality of word lines 3 1331 to 3 1338 (i.e., 3 1330) may be stacked in a direction (a Z-axis direction), perpendicular to an upper surface of the second substrate 3 1310. At least one string select line and at least one ground select line may be arranged on and below the plurality of word lines 3 1330, respectively, and the plurality of word lines 3 1330 may be disposed between the at least one string select line and the at least one ground select line.

In the bit line bonding area BLBA, a channel structure CH may extend in a direction, perpendicular to the upper surface of the second substrate 3 1310, and pass through the plurality of word lines 3 1330, the at least one string select line, and the at least one ground select line. The channel structure CH may include a data storage layer, a channel layer, a buried insulating layer, and the like, and the channel layer may be electrically connected to a first metal layer 3 1350c and a second metal layer 3 1360c. For example, the first metal layer 3 1350c may be a bit line contact, and the second metal layer 3 1360c may be a bit line. In an example embodiment, the bit line 3 1360c may extend in a first direction (a Y-axis direction), parallel to the upper surface of the second substrate 3 1310.

In an example embodiment illustrated in FIG. 13, an area in which the channel structure CH, the bit line 3 1360c, and the like are disposed may be defined as the bit line bonding area BLBA. In the bit line bonding area BLBA, the bit line 3 1360c may be electrically connected to the circuit elements 2 1220*c* providing a page buffer 3 1393 in the peripheral circuit region PERI. For example, the bit line 3 1360*c* may be connected to upper bonding metals 3 1371*c* and 3 1372*c* in the cell region CELL, and the upper bonding metals 3 1371*c* and 3 1372*c* may be connected to lower bonding metals 2 1271*c* and 2 1272*c* connected to the circuit elements 2 1220*c* of the page buffer 3 1393.

In the word line bonding area WLBA, the plurality of word lines 3 1330 may extend in a second direction (an X-axis direction), parallel to the upper surface of the second substrate 3 1310, and may be connected to a plurality of cell contact plugs 3 1341 to 3 1347 (i.e., 3 1340). The plurality of word lines 3 1330 and the plurality of cell contact plugs 3 1340 may be connected to each other in pads provided by at least a portion of the plurality of word lines 3 1330 extending in different lengths in the second direction. A first metal layer 3 1350*b* and a second metal layer 3 1360*b* may be connected to an upper portion of the plurality of cell contact plugs 3 1340 connected to the plurality of word lines 3 1330, sequentially. The plurality of cell contact plugs 3 1340 may be connected to the circuit region PERI by the upper bonding metals 3 1371*b* and 3 1372*b* of the cell region CELL and the lower bonding metals 2 1271*b* and 2 1272*b* of the peripheral circuit region PERI in the word line bonding area WLBA.

The plurality of cell contact plugs 3 1340 may be electrically connected to the circuit elements 2 1220*b* providing a row decoder 3 1394 in the peripheral circuit region PEM. In an example embodiment, operating voltages of the circuit elements 2 1220*b* providing the row decoder 3 1394 may be different than operating voltages of the circuit elements 2 1220*c* providing the page buffer 3 1393. For example, operating voltages of the circuit elements 2 1220*c* providing the page buffer 3 1393 may be greater than operating voltages of the circuit elements 2 1220*b* providing the row decoder 3 1394.

A common source line contact plug 3 1380 may be disposed in the external pad bonding area PA. The common source line contact plug 3 1380 may be formed of a conductive material such as a metal, a metal compound, polysilicon, or the like, and may be electrically connected to the common source line 3 1320. A first metal layer 3 1350*a* and a second metal layer 3 1360*a* may be stacked on an upper portion of the common source line contact plug 3 1380, sequentially. For example, an area in which the common source line contact plug 3 1380, the first metal layer 3 1350*a*, and the second metal layer 3 1360*a* are disposed may be defined as the external pad bonding area PA.

Input-output pads 2 1205 and 3 1305 may be disposed in the external pad bonding area PA. Referring to FIG. 13, a lower insulating film 2 1201 covering a lower surface of the first substrate 2 1210 may be formed below the first substrate 2 1210, and a first input-output pad 2 1205 may be formed on the lower insulating film 2 1201. The first input-output pad 2 1205 may be connected to at least one of the plurality of circuit elements 2 1220*a*, 2 1220*b*, and 2 1220*c* disposed in the peripheral circuit region PERI through a first input-output contact plug 2 1203, and may be separated from the first substrate 2 1210 by the lower insulating film 2 1201. In addition, a side insulating film may be disposed between the first input-output contact plug 2 1203 and the first substrate 2 1210 to electrically separate the first input-output contact plug 2 1203 and the first substrate 2 1210.

Referring to FIG. 13, an upper insulating film 3 1301 covering the upper surface of the second substrate 3 1310 may be formed on the second substrate 3 1310, and a second input-output pad 3 1305 may be disposed on the upper insulating layer 3 1301. The second input-output pad 3 1305 may be connected to at least one of the plurality of circuit elements 2 1220*a*, 2 1220*b*, and 2 1220*c* disposed in the peripheral circuit region PERI through a second input-output contact plug 3 1303.

According to embodiments, the second substrate 3 1310 and the common source line 3 1320 may not be disposed in an area in which the second input-output contact plug 3 1303 is disposed. Also, the second input-output pad 3 1305 may not overlap the word lines 3 1330 in the third direction (the Z-axis direction). Referring to FIG. 13, the second input-output contact plug 3 1303 may be separated from the second substrate 3 1310 in a direction, parallel to the upper surface of the second substrate 3 1310, and may pass through the interlayer insulating layer 3 1315 of the cell region CELL to be connected to the second input-output pad 3 1305 and the lower bonding metals 1271*a* and 1272*a* of the peripheral circuit area PERI.

According to embodiments, the first input-output pad 2 1205 and the second input-output pad 3 1305 may be selectively formed. For example, the memory device 4 1400 may include only the first input-output pad 2 1205 disposed on the first substrate 2 1210 or the second input-output pad 3 1305 disposed on the second substrate 3 1310. Alternatively, the memory device 4 1400 may include both the first input-output pad 2 1205 and the second input-output pad 3 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 4 1400 may include a lower metal pattern 2 1273*a*, corresponding to an upper metal pattern 3 1372*a* formed in an uppermost metal layer of the cell region CELL, and having the same shape as the upper metal pattern 3 1372*a* of the cell region CELL, in an uppermost metal layer of the peripheral circuit region PERI. In the peripheral circuit region PERI, the lower metal pattern 2 1273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2 1271*b* and 2 1272*b* may be formed on the second metal layer 2 1240*b* in the word line bonding area WLBA. In the word line bonding area WLBA, the lower bonding metals 2 1271*b* and 2 1272*b* of the peripheral circuit region PERI may be electrically connected to the upper bonding metals 3 1371*b* and 3 1372*b* of the cell region CELL by a Cu—Cu bonding.

Further, the bit line bonding area BLBA, an upper metal pattern 3 1392, corresponding to a lower metal pattern 2 1252 formed in the uppermost metal layer of the peripheral circuit region PERI, and having the same shape as the lower metal pattern 2 1252 of the peripheral circuit region PERI, may be formed in an uppermost metal layer of the cell region CELL. A contact may not be formed on the upper metal pattern 3 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PEM, and a contact may not be formed on the reinforcement metal pattern.

In an example embodiment, the cell region CELL may include the memory block 200. The peripheral circuit region may include the peripheral circuit 100. The X-direction may correspond to an opposite direction of the first direction. The Y-direction may correspond to the second direction. The Z-direction may correspond to an opposite direction of the third direction. The peripheral circuit 100 may be flipped, and then stacked on the memory block 200 to form the nonvolatile memory device 1400.

The lower bonding metals 1271b and 1272b on the cell region CELL and the upper bonding metals 1371b and 1372b may replace connection functions of the through vias 311 through 330 and upper conductive layers 271 through 290 between the peripheral circuit 100 and the memory block 200. The memory cell vias 241 through 264 may be connected to the lower bonding metals 1271a and 1272a which is stacked on the memory cell vias 241 through 264 along the third direction to be connected to the upper bonding metals 371b and 372b of the peripheral circuit 100.

While the inventive concept has been described with reference to various exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
    a memory cell region including first metal pads; and
    a peripheral circuit region that includes a plurality of elements and second metal pads;
    wherein the memory cell region further includes:
        a vertical structure including a plurality of layer pairs, each layer pair including a first insulating layer and a first conductive layer that extend along a first direction and that are stacked in a second direction perpendicular to the first direction;
        a second insulating layer on the vertical structure;
        a second conductive layer and a third conductive layer on the second insulating layer, the second conductive layer and the third conductive layer being spaced apart from each other along the first direction to expose a first region of the second insulating layer between the second conductive layer and the third conductive layer;
        a plurality of first vertical channels that penetrate the second conductive layer, the second insulating layer, and the vertical structure in the second direction; and
        a plurality of second vertical channels that penetrate the third conductive layer, the second insulating layer, and the vertical structure in the second direction, and
    wherein the second conductive layer and the third conductive layer are connected with a first part of the first metal pads, and the peripheral circuit region is vertically connected to the memory cell region by the first metal pads and the second metal pads directly.

2. The nonvolatile memory device of claim 1, wherein the first metal pads and the second metal pads are formed of copper.

3. The nonvolatile memory device of claim 1, wherein the second conductive layer is connected with a second part of the first metal pads, and
    wherein the third conductive layer is connected with a third part of the first metal pads.

4. The nonvolatile memory device of claim 1, wherein the memory cell region further includes:
    a fourth conductive layer on the second insulating layer, the fourth conductive layer being spaced apart from the second conductive layer in a third direction that is perpendicular to the first direction and the second direction;
    a fifth conductive layer on the second insulating layer, the fifth conductive layer being spaced apart from the third conductive layer in the third direction and being spaced apart from the fourth conductive layer in the first direction to expose a second region of the second insulating layer between the fourth conductive layer and the fifth conductive layer;
    a plurality of third vertical channels that penetrate the fourth conductive layer, the second insulating layer, and the vertical structure in the second direction; and
    a plurality of fourth vertical channels that penetrate the fifth conductive layer, the second insulating layer, and the vertical structure in the second direction, and
    wherein the fourth conductive layer and the fifth conductive layer are connected with a second part of the first metal pads.

5. The nonvolatile memory device of claim 4, wherein the fourth conductive layer is connected with a third part of the first metal pads, and
    wherein the fifth conductive layer is connected with a fourth part of the first metal pads.

6. The nonvolatile memory device of claim 4, wherein the memory cell region is formed on a first wafer and the peripheral circuit region is formed on a second wafer.

7. The nonvolatile memory device of claim 4, wherein the first metal pads and the second metal pads are connected by a bonding manner.

8. The nonvolatile memory device of claim 4, wherein the memory cell region further includes:
    a sixth conductive layer on the second insulating layer, the sixth conductive layer being spaced apart from the fourth conductive layer in the third direction;
    a seventh conductive layer on the second insulating layer, the seventh conductive layer being spaced apart from the fifth conductive layer in the third direction and being spaced apart from the sixth conductive layer in the first direction to expose a third region of the second insulating layer between the seventh conductive layer and the sixth conductive layer;
    a plurality of fifth vertical channels that penetrate the sixth conductive layer, the second insulating layer, and the vertical structure in the second direction; and
    a plurality of sixth vertical channels that penetrate the seventh conductive layer, the second insulating layer, and the vertical structure in the second direction, and
    wherein the sixth conductive layer and the seventh conductive layer are connected with a third part of the first metal pads.

9. The nonvolatile memory device of claim 8, wherein the sixth conductive layer is connected with a fourth part of the first metal pads, and
    wherein the seventh conductive layer is connected with a fifth part of the first metal pads.

10. The nonvolatile memory device of claim 8, wherein the plurality of first vertical channels, the plurality of third vertical channels, and the plurality of fifth vertical channels are classified into a plurality of groups extending along the third direction, and wherein each of the plurality of groups includes 12 vertical channels disposed in turn in two columns along the third direction.

11. The nonvolatile memory device of claim 10, wherein a first boundary between the second conductive layer and the fourth conductive layer and a second boundary between the fourth conductive layer and the sixth conductive layer have a wave shape such that a distance from vertical channels that are closest to each of the first boundary and the second boundary from among the 12 vertical channels is a threshold distance or greater.

12. The nonvolatile memory device of claim 8, wherein the plurality of first vertical channels, the plurality of third vertical channels, and the plurality of fifth vertical channels are classified into a plurality of groups extending along the third direction, and wherein each of the plurality of groups includes 14 vertical channels disposed in turn in two columns along the third direction.

13. The nonvolatile memory device of claim 12, wherein one vertical channel of the 14 vertical channels is placed at a first boundary between the second conductive layer and the fourth conductive layer, and wherein another vertical channel of the 14 vertical channels is placed at a second boundary between the fourth conductive layer and the sixth conductive layer.

14. The nonvolatile memory device of claim 1, wherein each first conductive layer includes tungsten, and the second conductive layer and the third conductive layer include polysilicon.

15. The nonvolatile memory device of claim 1, wherein the memory cell region further includes:
a third insulating layer on the second conductive layer;
a fourth conductive layer on the third insulating layer;
a fourth insulating layer on the third conductive layer; and
a fifth conductive layer on the fourth insulating layer, and
wherein the fourth conductive layer and the fifth conductive layer are connected with a second part of the first metal pads.

16. The nonvolatile memory device of claim 1, wherein the memory cell region further includes:
a fourth conductive layer on the second insulating layer, the fourth conductive layer being spaced apart from the third conductive layer in a third direction to expose a second region of the second insulating layer between the fourth conductive layer and the third conductive layer; and
a plurality of third vertical channels that penetrate the fourth conductive layer, the second insulating layer, and the vertical structure in the second direction, and
wherein the third conductive layer and the fourth conductive layer are connected with a second part of the first metal pads.

17. A nonvolatile memory device comprising:
a peripheral circuit region that includes a first metal pads and at least three pass transistors; and
a memory cell region comprising:
second metal pads;
a vertical structure including a plurality of layer pairs, each layer pair including a first insulating layer and a first conductive layer that extend along a first direction and are stacked in a second direction perpendicular to the first direction;
a second insulating layer on the vertical structure;
a second conductive layer and a third conductive layer on the second insulating layer, the second conductive layer and the third conductive layer being spaced apart from each other in the first direction to expose a region of the second insulating layer between the second conductive layer and the third conductive layer;
a plurality of first vertical channels that penetrate the second conductive layer, the second insulating layer, and the vertical structure in the second direction; and
a plurality of second vertical channels that penetrate the third conductive layer, the second insulating layer, and the vertical structure in the second direction,
wherein the at least three pass transistors supply a common voltage to the second conductive layer and the third conductive layer through at least three of the first metal pads and at least three of the second metal pads, and the peripheral circuit region is vertically connected to the memory cell region by the first metal pads and the second metal pads directly.

18. The nonvolatile memory device of claim 17, wherein the first metal pads and the second metal pads are connected by a bonding manner.

19. The nonvolatile memory device of claim 17, wherein the second conductive layer and the third conductive layer are one string selection line,
wherein the second conductive layer forms a plurality of first string selection transistors connected to the one string selection line together with the plurality of first vertical channels, and
wherein the third conductive layer forms a plurality of second string selection transistors connected to the one string selection line together with the plurality of second vertical channels.

20. A nonvolatile memory device comprising:
a peripheral circuit region that includes a first metal pads and a plurality of elements; and
a memory cell region comprising:
a second metal pads;
a vertical structure including a plurality of layer pairs, each layer pair including a first insulating layer and a first conductive layer that extend along a first direction and are stacked in a second direction perpendicular to the first direction;
a second insulating layer on the vertical structure;
a second conductive layer and a third conductive layer on the second insulating layer, the second conductive layer and the third conductive layer being spaced apart from each other in the first direction to expose a first region of the second insulating layer between the second conductive layer and the third conductive layer;
a fourth conductive layer and a fifth conductive layer on the second insulating layer, the fourth conductive layer and the fifth conductive layer being spaced apart from each other in the first direction to expose a second region of the second insulating layer between the fourth conductive layer and the fifth conductive layer, and being parallel to the second conductive layer and the third conductive layer in a third direction perpendicular to the first direction and the second direction;
a sixth conductive layer and a seventh conductive layer on the second insulating layer, the sixth conductive layer and the seventh conductive layer being spaced apart from each other in the first direction to expose a third region of the second insulating layer between the sixth conductive layer and the seventh conductive layer, and being parallel to the fourth conductive layer and the fifth conductive layer in the third direction; and a plurality of vertical channels that penetrate the vertical structure in the second direction, wherein the second conductive layer and the third conductive layer are connected with a first part of the second metal pads, wherein the fourth conductive layer and the fifth conductive layer are connected with a second part of the second metal pads, and wherein the sixth conductive layer and the seventh conductive layer are connected with a third part of the second metal pads, and the peripheral circuit region is vertically connected to the memory cell region by the first metal pads and the second metal pads directly.

* * * * *